(12) United States Patent
Rajagopal et al.

(10) Patent No.: US 11,881,867 B2
(45) Date of Patent: *Jan. 23, 2024

(54) CALIBRATION SCHEME FOR FILLING LOOKUP TABLE IN AN ADC

(71) Applicant: TEXAS INSTRUMENTS INCORPORATED, Dallas, TX (US)

(72) Inventors: Narasimhan Rajagopal, Chennai (IN); Eeshan Miglani, Chhindwara (IN); Chirag Chandrahas Shetty, Thane (IN); Neeraj Shrivastava, Bengaluru (IN); Shagun Dusad, Bengaluru (IN); Srinivas Kumar Reddy Naru, Bengaluru (IN); Nithin Gopinath, Bengaluru (IN); Charls Babu, Thrissur (IN); Shivam Srivastava, Jaunpur (IN); Viswanathan Nagarajan, Bengaluru (IN); Jagannathan Venkataraman, Bengaluru (IN); Harshit Moondra, Mumbai (IN); Prasanth K, Kerala (IN); Visvesvaraya Appala Pentakota, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/467,561

(22) Filed: Sep. 7, 2021

(65) Prior Publication Data
US 2022/0247420 A1 Aug. 4, 2022

(30) Foreign Application Priority Data
Feb. 1, 2021 (IN) .............................. 202141004382

(51) Int. Cl.
*H03M 1/10* (2006.01)

(52) U.S. Cl.
CPC ................................. *H03M 1/1019* (2013.01)

(58) Field of Classification Search
CPC .. H03M 1/1019; H03M 1/365; H03M 1/0624; H03M 1/0836
See application file for complete search history.

(56) References Cited

U.S. PATENT DOCUMENTS 4,612,533 A 9/1986 Evans
4,899,071 A 2/1990 Morales
(Continued)

FOREIGN PATENT DOCUMENTS

CN 111064468 A 4/2020
EP 3716486 A1 9/2020
(Continued)

OTHER PUBLICATIONS

U.S. Appl. No. 17/158,526, Notice of Allowance, dated Jan. 14, 2022, p. 8.
(Continued)

*Primary Examiner* — Lam T Mai
(74) *Attorney, Agent, or Firm* — Valerie M. Davis; Frank D. Cimino

(57) ABSTRACT

In described examples, a circuit includes a calibration engine. The calibration engine generates multiple input codes. A digital to analog converter (DAC) is coupled to the calibration engine, and generates a first calibration signal in response to a first input code of the multiple input codes. An analog to digital converter (ADC) is coupled to the DAC, and generates multiple raw codes responsive to the first calibration signal. A storage circuit is coupled to the ADC and stores a first output code corresponding to the first input code. The first output code is obtained using the multiple raw codes generated by the ADC.

22 Claims, 8 Drawing Sheets

(56) References Cited

U.S. PATENT DOCUMENTS

| | | | |
|---|---|---|---|
| 4,928,103 A | 5/1990 | Lane | |
| 5,317,721 A | 5/1994 | Robinson | |
| 5,495,247 A | 2/1996 | Yamamoto et al. | |
| 5,563,533 A | 10/1996 | Cave et al. | |
| 5,821,780 A | 10/1998 | Hasegawa | |
| 6,002,352 A | 12/1999 | El-Ghoroury et al. | |
| 6,046,612 A | 4/2000 | Taft | |
| 6,069,579 A | 5/2000 | Ito et al. | |
| 6,124,746 A | 9/2000 | Van Zalinge | |
| 6,144,231 A | 11/2000 | Goldblatt | |
| 6,314,149 B1 | 11/2001 | Daffron | |
| 6,377,200 B1 | 4/2002 | Lee | |
| 6,590,517 B1 | 7/2003 | Swanson | |
| 6,720,895 B2 | 4/2004 | Poulton et al. | |
| 6,822,596 B2 | 11/2004 | Theiler | |
| 6,836,127 B2 | 12/2004 | Marshall | |
| 6,857,002 B1 | 2/2005 | Thomsen | |
| 7,046,179 B1 | 5/2006 | Taft et al. | |
| 7,142,138 B2 | 11/2006 | Chen et al. | |
| 7,233,172 B2 | 6/2007 | Kanamori et al. | |
| 7,262,724 B2 | 8/2007 | Hughes et al. | |
| 7,379,007 B2 | 5/2008 | Noguchi | |
| 7,379,010 B2 | 5/2008 | Tero | |
| 7,405,689 B2 | 7/2008 | Kernahan et al. | |
| 7,501,862 B2 | 3/2009 | Su et al. | |
| 7,525,471 B2 | 4/2009 | Prodic et al. | |
| 7,557,746 B1 | 7/2009 | Waltari | |
| 7,737,875 B2 | 6/2010 | Waltari et al. | |
| 7,738,265 B2 | 6/2010 | Trattler | |
| 7,839,323 B2 | 11/2010 | Kidambi | |
| 7,847,576 B2 | 12/2010 | Koiima | |
| 7,884,748 B2 | 2/2011 | Dekagbes | |
| 7,916,064 B2 | 3/2011 | Lin et al. | |
| 7,919,994 B2 | 4/2011 | Walker | |
| 8,089,388 B2 | 1/2012 | Cui et al. | |
| 8,130,130 B2 | 3/2012 | Danjo et al. | |
| 8,183,903 B2 | 5/2012 | Glass et al. | |
| 8,373,444 B2 | 2/2013 | Lee et al. | |
| 8,421,664 B2 | 4/2013 | Ryu et al. | |
| 8,514,121 B1 | 8/2013 | Shu | |
| 8,558,725 B2 | 10/2013 | Kidambi | |
| 8,773,169 B2 | 7/2014 | Dine et al. | |
| 8,836,375 B2 | 9/2014 | Ghatak | |
| 8,896,476 B2 | 11/2014 | Harpe | |
| 9,350,374 B2 | 5/2016 | Sundblad et al. | |
| 9,369,137 B2 | 6/2016 | Masuko | |
| 9,379,007 B2 | 6/2016 | Arvin | |
| 9,455,695 B2 | 9/2016 | Kull et al. | |
| 9,467,160 B2 | 10/2016 | Chang | |
| 9,503,116 B2 | 11/2016 | Speir et al. | |
| 9,548,752 B1 * | 1/2017 | Shrivastava | H03M 1/66 |
| 9,559,716 B1 * | 1/2017 | Matsui | H03M 1/1061 |
| 9,685,971 B2 | 6/2017 | Harada | |
| 9,742,424 B2 | 8/2017 | Sharma et al. | |
| 9,917,590 B2 | 3/2018 | Zhang et al. | |
| 10,003,353 B2 | 6/2018 | Kris et al. | |
| 10,103,753 B1 * | 10/2018 | Nagarajan | H03M 13/39 |
| 10,284,188 B1 | 5/2019 | Soundarajan et al. | |
| 10,673,452 B1 | 6/2020 | Soundararajan et al. | |
| 10,673,453 B1 | 6/2020 | Pentakota | |
| 10,673,456 B1 | 6/2020 | Dusad et al. | |
| 10,778,243 B2 | 9/2020 | Pentakota et al. | |
| 10,840,934 B2 * | 11/2020 | Benjaram | H03M 1/1042 |
| 10,958,258 B2 | 3/2021 | Soundararajan et al. | |
| 11,316,525 B1 * | 4/2022 | Pentakota | H03M 1/662 |
| 11,316,526 B1 * | 4/2022 | Rajagopal | H03M 1/502 |
| 2005/0104626 A1 | 5/2005 | Wakamatsu et al. | |
| 2006/0158365 A1 | 7/2006 | Kernahan et al. | |
| 2006/0220935 A1 | 10/2006 | Hughes et al. | |
| 2008/0297381 A1 | 12/2008 | Kernahan et al. | |
| 2009/0153388 A1 | 6/2009 | Waltari et al. | |
| 2009/0302888 A1 | 12/2009 | Shumarayev et al. | |
| 2010/0085101 A1 | 4/2010 | Walker | |
| 2010/0085232 A1 | 4/2010 | Nicolas | |
| 2011/0109488 A1 | 5/2011 | Nakajima | |
| 2012/0105264 A1 | 5/2012 | Ryu et al. | |
| 2012/0176158 A1 | 7/2012 | Lee et al. | |
| 2012/0212358 A1 | 8/2012 | Shi et al. | |
| 2012/0326904 A1 | 12/2012 | Jensen | |
| 2013/0009796 A1 | 1/2013 | Sakiyama et al. | |
| 2013/0021118 A1 | 1/2013 | Kabir et al. | |
| 2013/0106632 A1 | 5/2013 | Petigny et al. | |
| 2013/0169463 A1 | 7/2013 | Stein et al. | |
| 2014/0361917 A1 | 12/2014 | Matsuno et al. | |
| 2015/0008894 A1 | 1/2015 | Cannankurichi et al. | |
| 2015/0244386 A1 | 8/2015 | El Chammas | |
| 2015/0260552 A1 | 9/2015 | Tao et al. | |
| 2017/0117914 A1 | 4/2017 | Choi | |
| 2017/0214411 A1 * | 7/2017 | Liu | H03M 1/001 |
| 2019/0007071 A1 | 1/2019 | Nagarajan et al. | |
| 2019/0280703 A1 | 9/2019 | Naru et al. | |
| 2019/0296756 A1 | 9/2019 | Ali | |
| 2020/0195268 A1 | 6/2020 | Soundarajan et al. | |
| 2020/0204184 A1 | 6/2020 | Rattan | |
| 2020/0259502 A1 | 8/2020 | Dusad et al. | |
| 2020/0403632 A1 | 12/2020 | Chen et al. | |
| 2021/0126644 A1 * | 4/2021 | Sharma | H03M 1/0836 |
| 2021/0359694 A1 * | 11/2021 | Chen | H03M 1/0624 |
| 2022/0224349 A1 * | 7/2022 | Varshney | H03M 1/1009 |
| 2022/0247421 A1 * | 8/2022 | Pentakota | H03M 1/1038 |
| 2022/0294461 A1 * | 9/2022 | Huynh | H03M 1/1245 |

FOREIGN PATENT DOCUMENTS

| | | |
|---|---|---|
| JP | H05206801 | 8/1993 |
| KR | 20000028857 | 5/2000 |
| KR | 2001044806 | 2/2001 |
| KR | 20020015863 | 3/2002 |
| WO | 2004038922 | 5/2004 |

OTHER PUBLICATIONS

U.S. Appl. No. 16/517,796, Notice of Allowance, dated Feb. 6, 2020, p. 7.

U.S. Appl. No. 16/410,698, Notice of Allowance, dated Feb. 10, 2020, p. 6.

International Search Report in corresponding PCT Patent Application No. PCT/2018-068162, dated Apr. 25, 2019 (2 pages).

International Search Report in corresponding PCT Patent Application No. PCT/2021-063021, dated Mar. 31, 2022 (3 pages).

International Search Report in corresponding PCT Patent Application No. PCT/2021-064260, dated Apr. 7, 2022 (3 pages).

International Search Report in corresponding PCT Patent Application No. PCT/2022-012066, dated Apr. 7, 2022 (2 pages).

International Search Report in corresponding PCT Patent Application No. PCT/2022-013802, dated Apr. 28, 2022 (2 pages).

International Search Report in corresponding PCT Patent Application No. PCT/2022-014532, dated May 5, 2022 (2 pages).

* cited by examiner

CALIBRATION SCHEME FOR FILLING LOOKUP TABLE IN AN ADC

CROSS REFERENCES TO RELATED APPLICATIONS

This application claims priority from India provisional patent application No. 202141004382 filed on Feb. 1, 2021 which is hereby incorporated by reference in its entirety.

TECHNICAL FIELD

This description relates generally to analog to digital converters (ADCs), and more particularly to using a lookup-table in ADCs.

BACKGROUND

In many electronic devices, an analog input signal is converted to a digital output signal using an analog to digital converter (ADC). The ADC used for digitizing a signal in a radio-frequency (RF) sampling receiver may be required to operate at high speed. Such speeds may be in the order of giga samples per second (GSPS). However, there is a need to correct the non-linearity of the high-speed ADCs.

SUMMARY

In described examples, a circuit includes a calibration engine. The calibration engine generates multiple input codes. A digital to analog converter (DAC) is coupled to the calibration engine, and generates a first calibration signal in response to a first input code of the multiple input codes. An analog to digital converter (ADC) is coupled to the DAC, and generates multiple raw codes responsive to the first calibration signal. A storage circuit is coupled to the ADC and stores a first output code corresponding to the first input code. The first output code is obtained using the multiple raw codes generated by the ADC.

DETAILED DESCRIPTION OF EXAMPLE EMBODIMENTS

Figure 1:
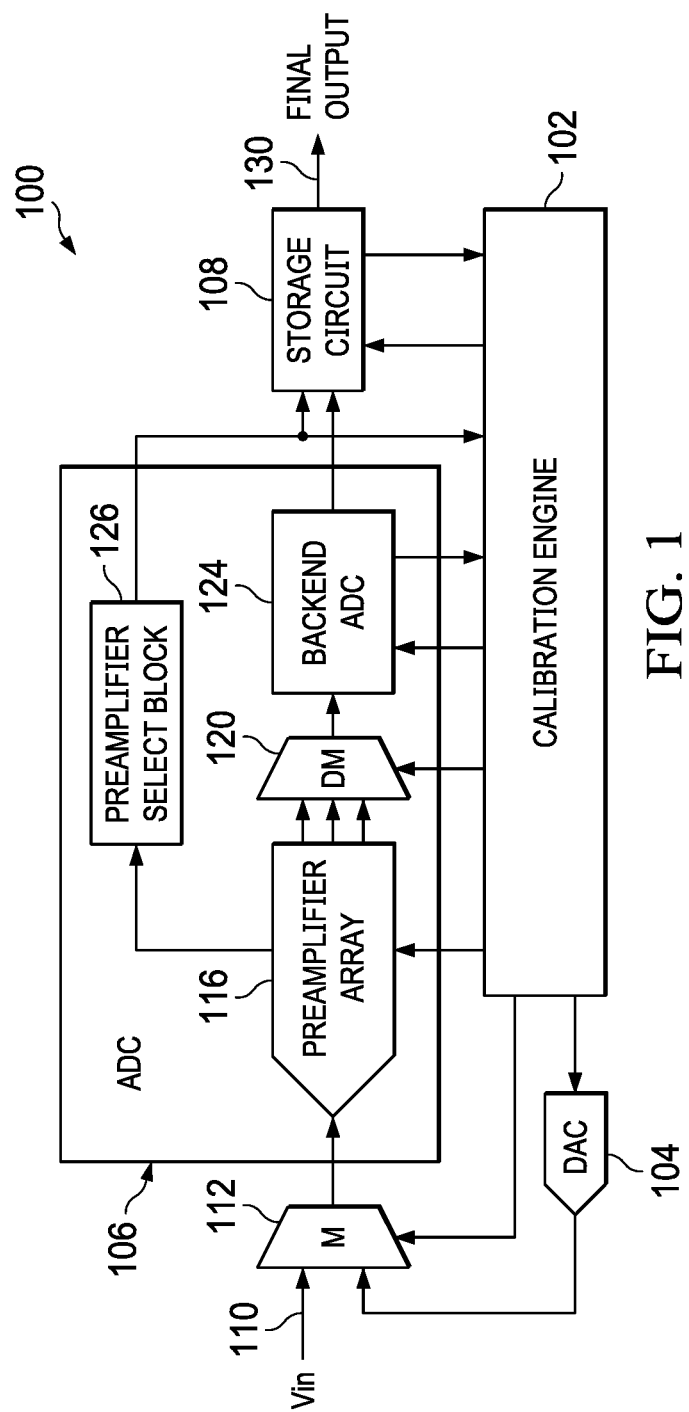
FIG. 1 is a block diagram of a circuit, according to an example embodiment.

FIG. 1 is a block diagram of a circuit 100, according to an example embodiment. The circuit 100 includes a calibration engine 102, a digital to analog converter (DAC) 104, an analog to digital converter (ADC) 106 and a storage circuit 108. The DAC 104 is coupled to the calibration engine 102. The ADC 106 is coupled to the DAC 104 via a multiplexer 112 and the calibration engine 102. The storage circuit 108 is coupled to the ADC 106. The storage circuit 108 is also coupled to the calibration engine 102.

The multiplexer M 112 is coupled between the DAC 104 and the ADC 106. The multiplexer M 112 is also coupled to the calibration engine 102. The multiplexer M 112 receives an input voltage Vin 110. The ADC 106 includes a preamplifier array 116, a delay multiplexer DM 120, a backend ADC 124 and a preamplifier selection block 126. The preamplifier array 116 is coupled to the multiplexer M 112 and includes multiple preamplifiers. The delay multiplexer DM 120 is coupled to the preamplifier array 116. The backend ADC 124 is coupled to the delay multiplexer DM 120. The storage circuit 108 is coupled to the backend ADC 124. The storage circuit 108 may be constructed of digital memory circuits, register, flip-flops, RAM, ROM, part of a conventional memory circuit or part of digital processor system. The calibration engine 102, in one example, is or is a part of, a processing unit, a digital signal processor (DSP), a processor and/or a programmable logic device. The calibration engine 102 may include memory and logic.

The preamplifier select block 126 is coupled to the preamplifier array 116, the storage circuit 108 and the calibration engine 102. All components of the ABC 106 are capable of communicating with the calibration engine 102 independently, and with other components of the circuit 100. However, all such connections are not discussed here for simplicity. Each block or component of the circuit 100 may also be coupled to other blocks in FIG. 1, but those connections are not described herein for brevity. The circuit 100 may include one or more conventional components that are not described herein for simplicity of the description.

The circuit 100, in one example, is an analog to digital converter. The circuit 100 operates in a calibration mode and a mission mode. In calibration mode, the calibration engine 102 generates multiple input codes that, in some example embodiments, correspond to a known analog signal magnitude. In one example, the multiple input codes range from a minimum input code to a maximum input code. The multiple input codes, in another example, include a first input code and a second input code. A difference between the first input code and the second input code is M, where M is an integer. In one example, M is 1. The DAC 104 generates a first calibration signal (e.g. a first analog calibration signal) in response to the first input code. The multiplexer M 112, in calibration mode, provides the first calibration signal to the ADC 106. The ADC 106 generates multiple raw codes in response to the first calibration signal.

In operation of the calibration mode, the ADC 106 operates in multiple cycles for each input code. The ADC 106 receives the first calibration signal corresponding to the first input code from the multiplexer M 112. The multiplexer M 112, in one example, is controlled by the calibration engine 102. Each pre-amplifier in the ADC 106 has a different threshold voltage. Each pre-amplifier in the preamplifier array 116 compares the first calibration signal to a threshold voltage (e.g. the threshold voltage associated with each preamplifier in the preamplifier array 116). The delay multiplexer DM 120 generates a delay signal based on an output of one of the preamplifiers. In the first cycle of ADC 106, the backend ADC 124 generates a first raw code in response to the delay signal. During subsequent cycles, the ADC 106 (operating in conjunction with the preamplifier array 116, the delay multiplexer DM 120 and the backend ADC 124) generates multiple raw codes corresponding to the first input code.

The storage circuit 108 stores a first output code corresponding to the first input code. The first output code is obtained using the multiple raw codes generated by the ADC 106, The first output code is the average of the multiple raw codes, in one example. In another example, the first output code is a mathematical function of the multiple raw codes. In one example embodiment, the storage circuit 108 maintains a look-up table to store the first output code corresponding to the first input code. In another example embodiment, the multiple raw codes generated by the ADC 106 are stored in the calibration engine 102. The calibration engine 102 estimates the first output code from the multiple raw codes, and stores the first output code in the look-up table in the storage circuit 108 corresponding to the first input code.

Similarly, the DAC 104 generates a second calibration signal in response to the second input code generated by the calibration engine 102. The ADC 106 generates (e.g. in one or more cycles) multiple raw codes in response to the second calibration signal. The storage circuit 108 stores a second output code corresponding to the second input code. The second output code is obtained using the multiple raw codes generated by the ADC 106 corresponding to the second input code. The first output code is stored in a first location in the storage circuit 108, and the second output code is stored in a second location in the storage circuit 108. In one example embodiment, the first output code is stored in a first address location in the look-up table in the storage circuit 108, and the second output code is stored in a second address location in the look-up table in the storage circuit 108. The look-up table, in one example, is a hybrid look-up table with each address location having multiple bits (e.g. 16 or 32 bits).

Thus, for each input code generated by the calibration engine 102, an output code is stored in the look-up table in the storage circuit 108. When a difference between the first input code and the second input code is 1 (i.e. M is 1), the first output code corresponding to the first input code is stored in the storage circuit 108. Thereafter, the calibration engine 102 generates the second input code, and the second output code corresponding to the second input code is stored in the storage circuit 108. When M is greater than one, the first output code corresponding to the first input code is stored in the storage circuit 108. The calibration engine 102 then generates the second input code, and the second output code corresponding to the second input code is stored in the look-up table in the storage circuit 108. Thereafter, the circuit 100 uses interpolation to estimate output codes for M−1 input codes that lie between the first and the second input code. These M output codes, in one example, are also stored in the look-up table in the storage circuit 108. The use of interpolation reduces time needed by the circuit 100 to estimate output codes corresponding to each input code in the calibration mode. Thus, the look-up table in the storage circuit 108 is populated in calibration mode with the input codes and corresponding output codes. This look-up table is used by the circuit 100 in mission mode, as discussed below.

Table 1 below is an example to illustrates the operation of the circuit 100 while operating in the calibration mode. The Table 1 illustrates input code generated by the calibration engine 102, multiple raw codes generated by the ADC 106 in response to an input code, and the output code stored in the look-up table in the storage circuit 108.

TABLE 1

| Input code | Raw codes | Output code |
|---|---|---|
| 51 | 97 | 100 |
|    | 99 |     |
|    | 102 |    |
|    | 101 |    |
|    | 99 |     |
|    | 100 |    |
|    | 102 |    |
|    | 100 |    |
|    | 104 |    |
|    | 98 |     |
|    | 96 |     |
|    | 100 |    |
|    | 102 |    |
|    | 101 |    |
|    | 101 |    |
|    | 99 |     |
| 52 | 104 | 105 |
|    | 105 |    |
|    | 107 |    |
|    | 103 |    |
|    | 105 |    |
|    | 105 |    |
|    | 108 |    |
|    | 103 |    |
|    | 105 |    |
|    | 106 |    |
|    | 104 |    |
|    | 107 |    |
|    | 105 |    |
|    | 106 |    |
|    | 107 |    |
|    | 104 |    |
| 53 | 109 | 108 |
|    | 106 |    |

As illustrated in Table 1, for input code 51 generated by the calibration engine 102, the ADC 106 generates multiple raw codes represented as 97, 99, 102 to 99. In this example, the ADC 106 generates 16 raw codes. The output code of 100 is stored in the storage circuit 108, and the output code is obtained using the multiple raw codes represented as 97, 99, 102 to 99. In the example illustrated in Table 1, the output code is determined by the average of the multiple raw codes and this output code is stored in the storage circuit 108. Thus, the output code is average of first 16 raw codes in Table 1. Similarly, for the input code 52, the output code of 105 is determined by the average of the raw codes 17-32 in Table 1, and this output code is stored in the storage circuit 108.

In one example embodiment, the calibration engine 102 generates ($2^N$) input codes. The DAC 104 accordingly generates ($2^N$) calibration signals. The calibration signal generated by the DAC 104 is provided as:

$$V_{DAC} = Vr/(2^N) \quad (1)$$

where, Vr is a range of the input voltage Vin 110, and is a difference in a highest and a lowest value of the input voltage Vin 110, and N bits is resolution of the ADC 106. Thus, for example, when the ADC 106 is a 9-bit ADC, the calibration engine 102 generates ($2^9$) input codes (512 input codes), and the DAC 104 generates 512 calibration signals. For each calibration signal, the ADC 106 generates multiple raw codes. The storage circuit 108 stores output codes for each input code. In one example, each output code is of N+n bits, where n is an integer and greater than zero. This mitigates the non-linearity of the ADC 106. When N is 9 and n is 2, a range of output codes stored in the storage circuit 108 varies from 0 to 2047 i.e. a total of 2048 ($2^{11}$). Thus, the look-up table in the storage circuit 108 stores ($2^N$) output codes corresponding to ($2^N$) input codes.

In the mission mode, the multiplexer M 112 provides the input voltage Vin 110 to the ADC 106. The multiplexer M 112 is controlled by the calibration engine 102. The ADC 106 generates a raw code in response to the input voltage Vin 110. An output code in the storage circuit 108 corresponding to the raw code is selected, and generated as a final output 130 by the circuit 100. For each value of the input voltage Vin 110, an output code is looked up in the look-up table and provided as the final output 130. When a value of the input voltage Vin 110 is beyond a maximum value (Vin_max) that can be resolved by the circuit 100, the circuit 100 generates a maximum output code stored in the look-up table corresponding to the Vin_max. When a value of the input voltage Vin 110 is less than a minimum value (Vin_min) that can be accommodated by the circuit 100, the circuit 100 generates a minimum output code stored in the look-up table corresponding to the Vin_min.

The multiplexer M 112, the ADC 106 and the storage circuit 108 form one channel in the circuit 100. Circuit 100 can be implemented with two or more channels. A second channel would include a second multiplexer, a second ADC and a second storage circuit. The second ADC in the second channel may be similar to the ADC 106 but both are calibrated separately as both may have different transfer functions because of different manufacturing specifications. Multiple channels allow the flexibility to have one channel in calibration mode and the other channels operate in mission mode. Thus, when one channel is being calibrated, other channels are used for analog to digital conversion. In one example, all the channels are calibrated using the DAC 104, and all channels are controlled by the calibration engine 102. In some example embodiments, there is no need to perform any matching between the channels as the ADC in each channel is calibrated independently. This also reduces the requirement of background estimation and calibration algorithms.

The circuit 100, in one example embodiment, use a non-linear ADC or a delay-based ADC for example ADC 106. Though the ADC 106 is highly non-linear, the circuit 100 is highly linear and operates at high speed with relaxed area and power requirements. The circuit 100 scales well with technology nodes. The circuit 100 pushes the high linearity requirement on the DAC 104 instead of ADC 106. This is advantageous because it is relatively less difficult to design and implement analog circuits for operation at lower speed with linearity and accuracy. According to the present disclosure, the ADC 106 may be designed to run at high speed by compromising linearity. However, coupled with the look-up table in the storage circuit 108, the ADC 106 behaves like linear analog-to-digital converters. Likewise, the storage circuit 108 may be implemented in digital circuits, and be configured for high speed.

Interfacing external analog signals to fast digital processing cores generally requires an ADC. With higher speeds in transmission of data, the ADC may be required to operate at very high speeds and with a good signal-to-noise ratio. Without the benefits of some example embodiments, such constraints could result in large power dissipation and large area requirements for the supporting integrated circuit. These issues may be especially prominent at GHz rates because of analog non-idealities which may limit performance. The example embodiments provide a lookup-table-based ADC approach that can open up wide architectures using one or more non-linear ADCs but can be calibrated to provide the superior performance of a highly linear ADC.

In calibration mode, the look-up table in the storage circuit 108 is populated, and in mission mode, the circuit 100 uses high speed ADC 106 and the storage circuit 108 to generate an output code corresponding to the input voltage Vin 110. Hence, the circuit 100 does not use any complex algorithms or hardware for digital conversion of the input voltage Vin 110. This reduces the area and power requirements of the circuit 100. Thus, the circuit 100 is capable of being used in RF sampling receivers which operate at speeds of GSPS. The circuit 100 scales well with technology nodes and is capable of supporting high GSPS transfer rates in future technology nodes.

Figure 2:
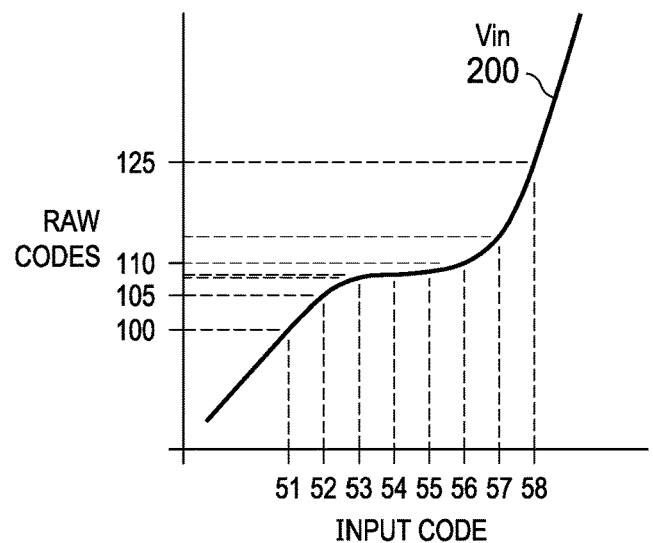
FIG. 2 is a graph illustrating input-output characteristic of an ADC, according to an example embodiment.

FIG. 2 is a graph illustrating input-output characteristic of an ADC, according to an example embodiment. The graph is explained in connection with the ADC 106 of circuit 100 illustrated in FIG. 1. The input voltage Vin 200 is similar to the input voltage Vin 110 illustrated in FIG. 1. The ADC 106 receives the calibration signal in the calibration mode, and the ADC 106 receives the input voltage Vin 200 in the mission mode. In general, the input voltage Vin 200 is a non-linear function but monotonic. This means that a unique output code is generated for each input code. However, the input voltage Vin 200 as illustrated in FIG. 2 can have non-monotonic regions. This will result in the same raw code being generated for one or more input codes. They might also result in incorrect generation of output codes corresponding to an input code. Thus, incorrect values of output codes would get stored in the look-up table in the storage circuit 108 corresponding to the received input voltage Vin 200. However, circuit 100 is able to avoid this issue as discussed below in more detail. Thus, the circuit 100 is able to handle the input voltage Vin 110 when it has non-monotonic regions similar to the input voltage Vin 200.

Table 2 below is an example to illustrates the input code generated by the calibration engine 102, multiple raw codes generated by the ADC 106 in response to an input code and the corrected output code as estimated by the calibration engine 102 and stored in the look-up table in the storage circuit 108 of circuit 100. Table 2, in the fourth column, also provides uncorrected output codes which might be stored in the look-up table in case the circuit 100 does not take a corrective measure which is explained below in detail.

TABLE 2

| Input code | Raw codes | Minimum expected raw code | Uncorrected Output code | Corrected Output code |
|---|---|---|---|---|
|  | . . . |  | 56 | 58 |
|  | 126 |  | 56 | 58 |
| 58 | 125 |  | 56 | 58 |

TABLE 2-continued

| Input code | Raw codes | Minimum expected raw code | Uncorrected Output code | Corrected Output code |
|---|---|---|---|---|
| | ... | | 55 | 57 |
| | 113 | | 55 | 57 |
| 57 | 112 | 112 | 55 | 57 |
| 56 | 110 | 111 | 54 | 56 |
| 55 | 108 | 110 | 53 | 55 |
| 54 | 108 | 109 | 53 | 54 |
| 53 | 108 | 106 | 53 | 53 |
| | 107 | | 52 | 52 |
| | 106 | | 52 | 52 |
| 52 | 105 | 101 | 52 | 52 |
| | ... | | 51 | 51 |
| | 101 | | 51 | 51 |
| 51 | 100 | 100 | 51 | 51 |
| | 99 | | 50 | 50 |
| | ... | | 50 | 50 |

A minimum expected raw code is a minimum raw output expected to make the transfer function monotonic. In one example, the minimum expected raw code in a current cycle is determined from the minimum raw code stored in a previous cycle. The storage circuit 108 stores a first output code corresponding to a first input code in a first location, and the second output code corresponding to a second input code is stored in a second location in the storage circuit 108. In circuit 100, when the second output code is less than a predetermined threshold, the second output code is incremented by defined bits and stored in a third location in the storage circuit 108. In the example illustrated in Table 2, the predetermined threshold is the output code stored in a previous cycle which in the current example is the first output code. In one example embodiment, the calibration engine 102 increments the output code by a variable amount such that the output code becomes higher than the predetermine threshold and then stores it in a third location in the storage circuit 108. In another example embodiment, a logic unit within or outside circuit 100 is responsible for comparing an output code with the predetermined threshold, and accordingly, incrementing the output code by defined bits before storing it in the third location in the storage circuit 108.

This is further explained using Table 2, As illustrated in Table 2, when the input code is 53, the uncorrected output code generated is 53 which is also the corrected output code. However, when the input code is 54, the uncorrected output code generated is 53. Hence, the circuit 100, keeps comparing the output code with a predetermined threshold. In one example, the predetermined threshold is an output code (corrected output code) stored in a previous cycle. As illustrated in Table 2, for input code 54, when the uncorrected output code generated is 53 which is same as corrected output code stored in previous cycle, the circuit 100 increments the output code by 1, and stores the corrected output code 54 in the look-up table. Similarly, for the input code 56, when the output code generated is 54 which is less than the corrected output code stored in the previous cycle, the circuit 100 increments the output code, and stores output code 56 (corrected output code) in the look-up table.

Thus, the circuit 100 is able to handle an ADC 106 which has non-linear characteristic function with non-monotonic regions. The circuit 100 uses a simple technique of comparing a current output code with a previously stored output code, and when both are the same, the current output code is incremented (in one example, incremented by 1) and stored in a third memory location in the look-up table of the storage circuit 108. In one example, the third memory location can be any location in the storage circuit 108, or it is the second location in the storage circuit 108. When the current output code is greater than the previously generated output code, the previously generated output code is stored in the first memory location and the current output code is stored in the second memory location. The first memory location and the second memory location, in one example, are subsequent locations in the look-up table in the storage circuit 108. Thus, the circuit 100 is able to store a unique output code in the look-up table for each input code even when the ADC 106 has a non-linear and non-monotonic characteristic function.

Figure 3:
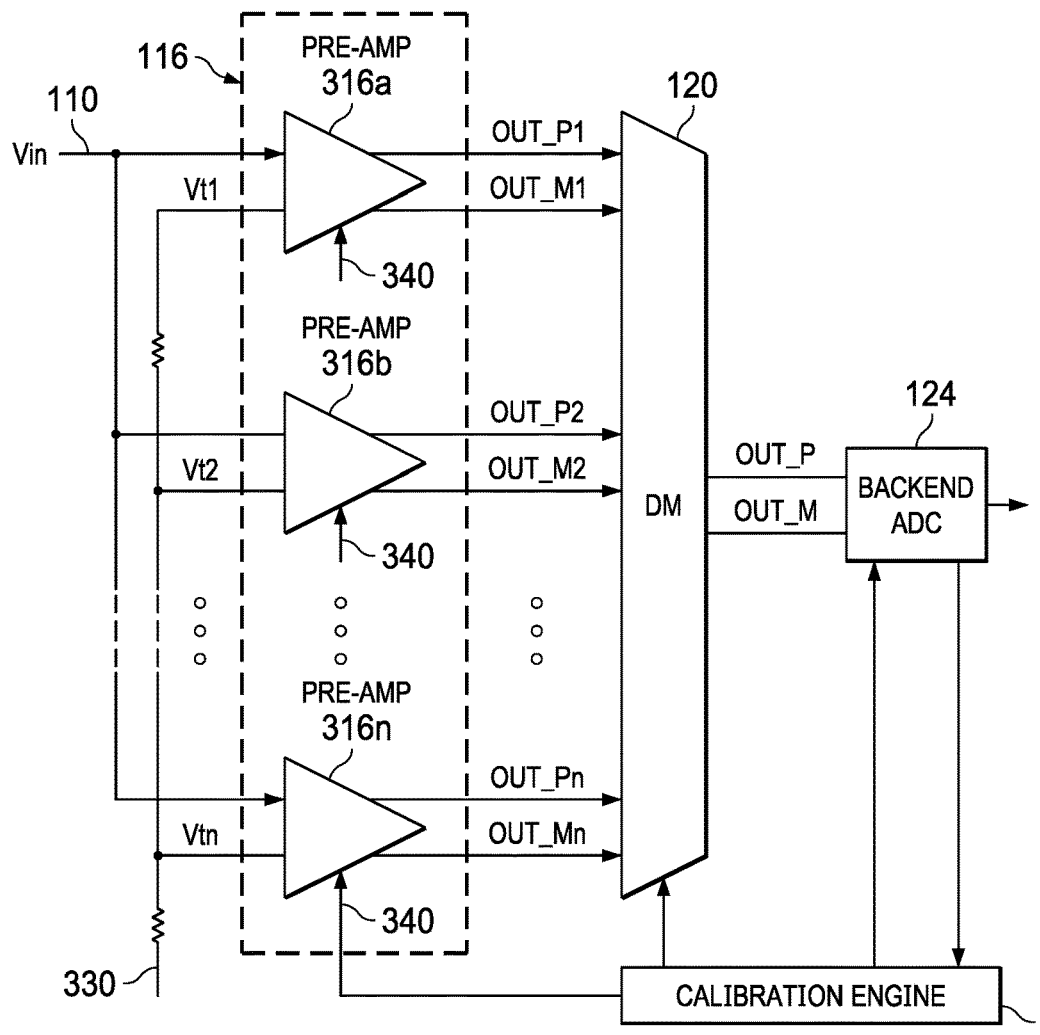
FIG. 3 is a block diagram of a portion of the circuit illustrated in FIG. 1, according to an example embodiment.

FIG. 3 is a block diagram of a portion of the circuit 100 illustrated in FIG. 1, according to an example embodiment. The preamplifier array 116 includes multiple preamplifiers from 1 to n, where n is an integer, for example, pre-amp 316a, pre-amp 316b to pre-amp 316n. In one example embodiment, one or more preamplifiers is a threshold integrated preamplifier. The delay multiplexer DM 120 is coupled to the multiple preamplifiers in the preamplifier array 116. The backend ADC 124 is coupled to the delay multiplexer DM 120 by differential signal lines, OUT_P and OUT_M. The calibration engine 102 is coupled to each preamplifier in the preamplifier array 116 via input 340, the delay multiplexer DM 120 and the backend ADC 124. The calibration engine 102 provides a timing signal to each preamplifier through line 340, which in one example embodiment is used to reset the preamplifiers.

In operation, the preamplifier array 116 receives the input voltage Vin 110 from the multiplexer M 112. Similar to amplifiers 54-60 of U.S. Pat. No. 10,673,456 (which is hereby incorporated by reference in its entirety), each preamplifier receives a different threshold voltage, for example, the pre-amp 316a receives a threshold voltage Vt1, the pre-amp 316b receives a threshold voltage Vt2 and the pre-amp 316n receives a threshold voltage Vtn. In one example, Vt1<Vt2<Vtn. The threshold voltages Vt1, Vt2 to Vtn are generated using, in one example embodiment, a voltage divider 330. Each preamplifier generates a first and a second output signals based on difference between the input voltage Vin 110 and the threshold voltage. For example, the pre-amp 316a generate differential signals—a first output signal OUT_M1 and a second output signal OUT_P1. Similarly, the pre-amp 316n generate differential signals—a first output signal OUT_Mn and a second output signal OUT_Pn.

Similar to the operation of multiplexer 211 in U.S. Pat. No. 10,673,452 (which is hereby incorporated by reference in its entirety), the delay multiplexer DM 120 receives the first and the second output signal from each preamplifier of the multiple preamplifiers. The delay multiplexer DM 120 generates a delay signal based on an output of one of the preamplifiers. The delay signal includes a first delay signal OUT_M and a second delay signal OUT_P, and corresponds to the output signals of a preamplifier whose threshold voltage is closest to the input voltage Vin 110. For example, if the input voltage Vin 110 is closest to the threshold voltage Vt1 of the pre-amp 316a, the first delay signal OUT_M and the second delay signal OUT_P corresponds to the first and second output signals OUT_M1 and OUT_P1 of the pre-amp 316a. On the other hand, if the input voltage Vin 110 is closest to the threshold voltage Vt2 of the pre-amp 316b, the first delay signal OUT_M and the second delay signal OUT_P corresponds to the first and second output signals OUT_M2 and OUT_P2 of the pre-amp 316b. In one example, the calibration engine 102 enables the delay multiplexer DM 120 to select the output signals of a preamplifier whose threshold voltage is closest to the input voltage Vin 110. The backend ADC 124 generates a first raw code in response to the delay signal.

The preamplifiers pre-amp 316a, pre-amp 316b to pre-amp 316n within the preamplifier array 116 have varying gains (e.g. "gain" as used herein may mean voltage gain, current gain or a delay—as discussed in more detail below, amplifiers/comparators have different delays based on the input signals) as a result of various factors, which may include design, process, input voltage VIN, and/or temperature. In one example, the gains and ranges of the preamplifier pre-amp 316a, pre-amp 316b to pre-amp 316n may be adjusted, and preferably matched across the preamplifier array 116. The preamplifier array 116 and the backend ADC 124 enables the circuit 100 to operate as a high-speed and high-performance analog to digital converter (ADC).

Figure 4:
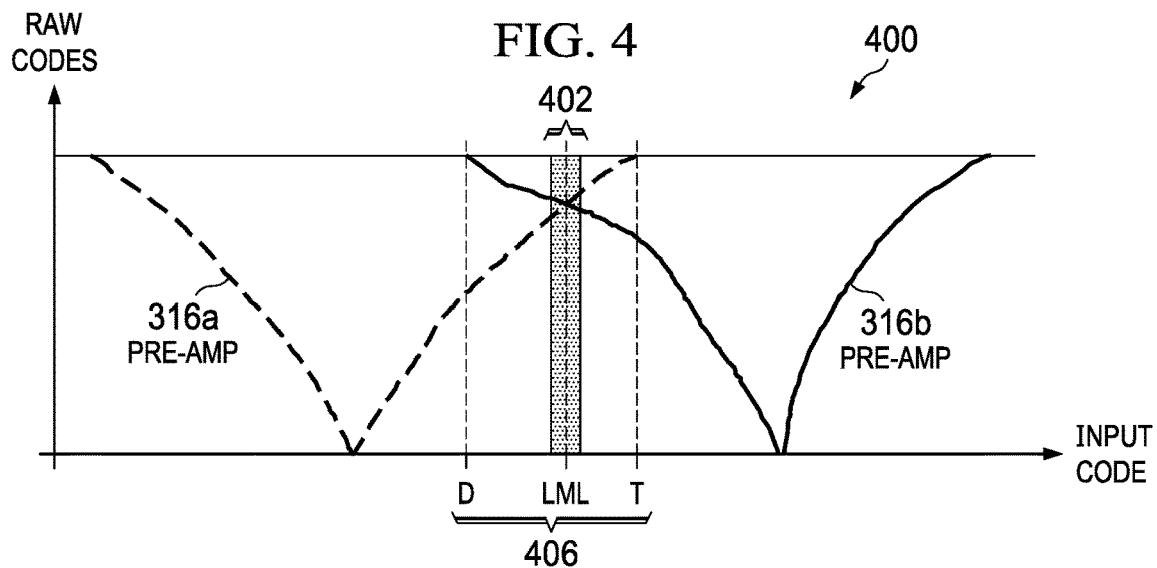
FIG. 4 is a graph of raw code as a function of input code for a set of preamplifiers in a circuit, according to an example embodiment.

FIG. 4 is a graph 400 of raw code as a function of input code for a set of preamplifiers in a circuit, according to an example embodiment. The graph is explained in connection with the pre-amp 316a and the pre-amp 316b illustrated in FIG. 3. The preamplifier pre-amp 316a and pre-amp 316b are part of the preamplifier array 116, illustrated in FIG. 1. The preamplifier pre-amp 316a and pre-amp 316b are adjacent preamplifiers and have successive threshold voltages. However, there is no single point transition between pre-amp 316a and pre-amp 316b, e.g. an overlap zone 402 (or an overlap zone 406) exists between pre-amp 316a and the pre-amp 316b. This is because of a thermal noise in comparators associated with preamplifiers. In case an input code is received in the overlap zone 402, both pre-amp 316a and the pre-amp 316b can generate an output or raw code. However, for same input code, raw code generated would be different based on which of the preamplifier, pre-amp 316a or the pre-amp 316b is selected. The circuit 100 provides two unique methods, in calibration mode, to ensure that a valid output code is generated irrespective of whether pre-amp 316a or pre-amp 316b is selected.

In the first method, the look-up table is filled for both the pre-amp 316a and the pre-amp 316b within the overlap zone 402. In calibration mode, the pre-amp 316a is activated. The storage circuit 108 stores M output codes corresponding to M input codes, where M is an integer. The pre-amp 316a toggles (e.g. the output of pre-amp 316a changes from one state, such as a low voltage value, to another state, such as a high voltage value) at the Mth input code. The pre-amp 316a is kept active to continue processing for (L) input codes. The look-up table in the storage circuit 108 stores (L) output codes generated for (L) input codes. Thus, for pre-amp 316a, the pre-amp 316a processes (M+L) input codes, and the storage circuit 108 stores (M+L) output codes corresponding to (M+L) input codes. In another step, the pre-amp 316a is inactivated, and the pre-amp 316b is activated. The input code is changed to (M−L+1). The storage circuit 108 stores output codes generated corresponding to each input code from (M−L+1)th input code. This method is further explained below in relationship to the values in Table 3.

Table 3 is based on the following example embodiment: (i) the backend ADC 124 is 11 bits; and (ii) there are 8 preamplifiers. Thus, each pre-amp generates 2048 (0-2047) raw codes. Overall, the circuit 100 acts as a 14-bit non-linear ADC with 16384 (0-16383) raw codes. To achieve a 13-bit linear ADC, the DAC 104 used is a 13-bit linear calibration DAC that receives 8192 (0-8191) input codes from the calibration engine 102. Thus, each preamplifier ideally receives 1024 input codes. Considering, for ease of explanation of Table 3, pre-amp 316a is the 3rd preamplifier and pre-amp 316b is the 4th preamplifier of the eight preamplifiers.

TABLE 3

| Input code | Pre-Amp | Pre-amp Raw code | Total raw code |
|---|---|---|---|
| 3069 | 316a | 1834 | 5930 |
| 3070 | 316a | 1836 | 5932 |
| 3071 | 316a | 1840 | 5936 |
| 3072 | 316a | 1841 | 5937 |
| 3073 | 316a | 1844 | 5940 |
| 3074 | 316a | 1846 | 5942 |
| 3075 | 316a | 1850 | 5946 |
| 3076 | 316a | 1852 | 5948 |
| 3077 | 316a | 1853 | 5949 |
| 3070 | 316b | 302 | 6446 |
| 3071 | 316b | 304 | 6448 |
| 3072 | 316b | 310 | 6454 |
| 3073 | 316b | 313 | 6457 |
| 3074 | 316b | 315 | 6459 |
| 3075 | 316b | 318 | 6462 |
| 3076 | 316b | 320 | 6464 |
| 3077 | 316b | 321 | 6465 |
| 3078 | 316b | 325 | 6469 |

In Table 3, the overlap is considered for 4 input codes, thus L is 4. M is 3073, M+L is 3077 and M−L+1 is 3070. A first pre-amplifier would process input codes from 0 to 1023, and a second pre-amplifier would process input codes from 1024 to 2047. Thus, from Table 3, pre-amp 316a is activated and processes input codes from 2048 to 3073. The pre-amp 316a toggles at input code 3073 (Mth input code). The pre-amp 316a is kept active to process input codes till 3077, (M+L)th input code. The storage circuit 108 stores (M+L) output codes for (M+L) input codes processed through the pre-amp 316a. After these values are stored in the storage circuit 108, the pre-amp 316a is inactivated and the pre-amp 316b is activated. The input code is changed to 3070 (M−L+1) and the same methodology is applied but with pre-amp 316b activated instead of pre-amp 316a. The storage circuit 108 stores output codes generated corresponding to each input code starting from 3070 input code onwards. Thus, this method ensures that the look-up table in the storage circuit 108 is filled for both the pre-amp 316a (including values relating to input codes up to 3073) and the pre-amp 316b (including values relating to input codes starting at 3070) within the overlap zone 402.

In the second method, the look-up table in the storage circuit 108 is filled for both the pre-amp 316a and the pre-amp 316b within the overlap zone 406. In calibration mode, the pre-amp 316a is activated. The storage circuit 108 stores M output codes corresponding to M input codes, where M is an integer. The pre-amp 316a toggles at Mth input code. The pre-amp 316a is kept active to continue processing to (T) input codes, where the raw code saturates at the Tth input code. The look-up table in the storage circuit 108 stores (T) output codes generated for (T) input codes. Thus, while the pre-amp 316a is active, the pre-amp 316a processes (M+T) input codes, and the storage circuit 108 stores (M+T) output codes. After these values are stored, the pre-amp 316a is inactivated, and the pre-amp 316b is activated. The input code is decremented from Tth input code to Dth input code, where raw code saturates at Dth input code. The storage circuit 108 stores output codes generated corresponding to each input code from Dth input code. This method is further explained below using Table 4.

The Table 4 is based on the same considerations as for Table 3. Similar to the example embodiment relating to Table 3, in this example embodiment the backend ADC 124 is 11 bits and there are 8 preamplifiers. Thus, each pre-amp generates 2048 (0-2047) raw codes. Overall, the circuit 100 acts as a 14-bit non-linear ADCs with 16384 (0-16383) raw codes. To achieve a 13-bit linear ADC, the DAC 104 used is a 13-bit linear calibration DAC that receives 8192 (0-8191) input codes from the calibration engine 102. Thus, each preamplifier ideally receives 1024 input codes. Considering, for ease of explanation of Table 4, pre-amp 316a is the 3$^{rd}$ preamplifier and pre-amp 316b is the 4th preamplifier in the eight preamplifiers.

TABLE 4

| Input code | Pre-Amp | Pre-Amp Raw code | Total raw code |
| --- | --- | --- | --- |
| 3069 | 316a | 1834 | 5930 |
| 3070 | 316a | 1836 | 5932 |
| 3071 | 316a | 1840 | 5936 |
| 3072 | 316a | 1841 | 5937 |
| 3073 | 316a | 1844 | 5940 |
| 3074 | 316a | 1846 | 5942 |
| 3075 | 316a | 1850 | 5946 |
| 3076 | 316a | 1852 | 5948 |
| 3077 | 316a | 1853 | 5949 |
| 3078 | 316a | 1856 | 5952 |
| 3079 | 316a | 1861 | 5957 |
| ... | 316a | ... | ... |
| 3118 | 316a | 2044 | 6140 |
| 3119 | 316a | 2047 | 6143 |
| 3009 | 316b | 0 | 6144 |
| 3010 | 316b | 2 | 6146 |
| ... | 316b | ... | ... |
| 3068 | 316b | 296 | 6440 |
| 3069 | 316b | 298 | 6442 |
| 3070 | 316b | 302 | 6446 |
| 3071 | 316b | 304 | 6448 |
| 3072 | 316b | 310 | 6454 |
| 3073 | 316b | 313 | 6457 |
| 3074 | 316b | 315 | 6459 |
| 3075 | 316b | 318 | 6462 |
| 3076 | 316b | 320 | 6464 |
| 3077 | 316b | 321 | 6465 |
| 3078 | 316b | 325 | 6469 |

In Table 4, M is 3073, T is 3119 and D is 3009. From Table 4, pre-amp 316a is activated and processes input codes to an input code of 3073. The pre-amp 316a toggles at input code 3073 (Mth input code). The pre-amp 316a is kept active to process input codes to input code 3119, (T)th input code. The storage circuit 108 stores (M+T) output codes for (M+T) input codes processed through the pre-amp 316a. Next, the pre-amp 316a is inactivated and the pre-amp 316b is activated. The input code is changed to 3009, Dth input code. The storage circuit 108 stores output codes generated corresponding to each input code from 3009 input code. Thus, this method ensures that the look-up table in the storage circuit 108 is filled for both the pre-amp 316a and the pre-amp 316b within the overlap zone 406. Also, in this method, the look-up table in the storage circuit 108 is filled without using detect comparators in the preamplifiers. This method can be used in case a variation in offset of a preamplifier is large across conditions like temperature.

The circuit 100, in addition, provides an additional method to evade the errors caused due to changes in gain and offset of preamplifiers. The change in gain and offset of preamplifiers is due to mismatches in the paths used in calibration mode and in mission mode. The mismatches in the two paths is attributed to component mismatch, common mode mismatch, flicker noise and temperature variations.

The changes in preamplifier gain (e.g. voltage gain and/or delay) and offset leads to discontinuities in the transfer function at points when the output code transitions from one preamplifier to another preamplifier. A flicker noise associated with the preamplifiers causes the discontinuity to change with system parameters such as temperature and time. The circuit 100 includes a solution that runs in the background to correct this discontinuity. The look-up table is filled for each adjacent preamplifier (e.g. the pre-amp 316a and the pre-amp 316b) within each overlap zone (e.g. overlap zone 402 for pre-amp 316a and pre-amp 316b). In calibration mode, the pre-amp 316a is activated, and the storage circuit 108 stores M output codes corresponding to M input codes, where M is an integer. If the pre-amp 316a toggles at Mth input code, the pre-amp 316a is kept active to continue processing for an additional (L) input code. The look-up table in the storage circuit 108 stores (L) output codes generated for (L) input codes. Thus, for pre-amp 316a, the pre-amp 316a processes (M+L) input codes, and the storage circuit 108 stores (M+L) output codes corresponding to (M+L) input codes. After storing these codes, the pre-amp 316a is inactivated, and the pre-amp 316b is activated. The input code is changed to (M−L+1). The storage circuit 108 stores output codes generated corresponding to each input code starting from (M−L+1)th input code.

A discontinuity parameter is estimated from the output codes generated through the first preamplifier from Mth input code to (M+L)th input code and the output codes generated through the second preamplifier from (M−L+1)th input code to the Mth input code. In one example, a first mean of the output codes generated through the first preamplifier from Mth input code to (M+L) input code is estimated. Also, a second mean of the output codes generated through the second preamplifier from (M−L+1)th input code to the Mth input code is estimated. The discontinuity parameter is estimated from a difference of the first mean and the second mean. The discontinuity parameter is added to the output codes generated through the second preamplifier and successive preamplifiers, when the discontinuity parameter is greater than a first threshold. This discontinuity parameter estimation and subsequent correction is performed for every preamplifier crossing.

This is explained in connection with Table 3. In Table 3, the overlap is considered for 4 input codes, thus L is 4. M is 3073, M+L is 3077 and M−L+1 is 3070. From Table 3, pre-amp 316a is activated and processes input codes from 2048 to 3073. The pre-amp 316a toggles at input code 3073 (Mth input code). The pre-amp 316a is kept active to process input codes to input code 3077, (M+L)th input code. The storage circuit 108 stores (M+L) output codes for (M+L) input codes processed through the pre-amp 316a. Next, the pre-amp 316a is inactivated and the pre-amp 316b is activated. The input code is changed to 3070 (M−L+1). The storage circuit 108 stores output codes generated corresponding to each input code from 3070 input code.

A first mean of the output codes generated for input codes 3070 to 3077 through the first preamplifier is estimated. Also, a second mean of the output codes generated for input codes 3070 to 3077 through the second preamplifier is estimated. The discontinuity parameter is estimated from a difference of the first mean and the second mean. The discontinuity parameter is added to the output codes generated through the second and successive preamplifiers, when the discontinuity parameter is greater than a first threshold. The first threshold, in one example, is dynamic and based on circuit 100 parameters. In another example, the first threshold is defined for circuit 100 after performing multiple tests.

In yet another example, the first threshold is zero. The process is repeated for each transition between two adjacent preamplifiers in circuit 100.

Thus, the circuit 100 addresses the issue of discontinuities in the transfer function at points when the output code transitions from one preamplifier to another preamplifier. The circuit 100, in one example embodiment, includes a discontinuity estimation and correction block coupled to the storage circuit 108. The discontinuity estimation and correction block estimates the discontinuity parameter which is then added to the output codes generated through the second and successive preamplifiers before generating the final output 130. This is further illustrated in FIG. 5. As the discontinuity parameter is estimated from output codes generated for same set of input codes, the effect of noise is nullified. Thus, the circuit 100 is able to provide significant improvement in time variation of harmonics due to flicker noise, and also a significant improvement in SNR (signal to noise ratio) and SFDR (Spurious-free dynamic range) performance.

Figure 5:
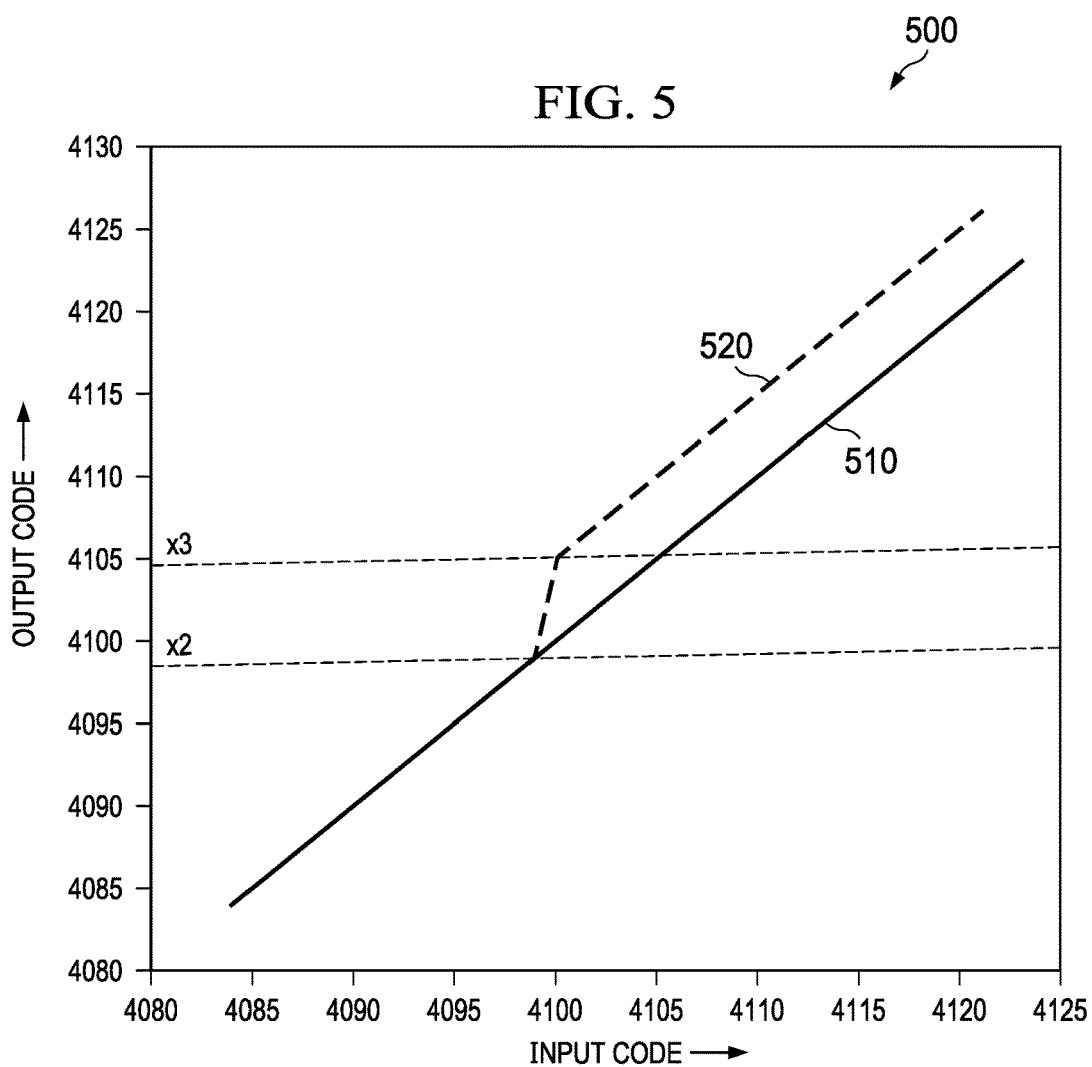
FIG. 5 is a graph of output code as a function of input code for a set of preamplifiers in a circuit, according to an example embodiment.

FIG. 5 is a graph 500 of output code as a function of input code for a set of preamplifiers in a circuit, according to an example embodiment. The graph is explained in connection with the pre-amp 316a and the pre-amp 316b illustrated in FIG. 3. The preamplifiers pre-amp 316a and pre-amp 316b are part of the preamplifier array 116, illustrated in FIG. 1. The preamplifiers pre-amp 316a and pre-amp 316b are adjacent preamplifiers and have successive threshold voltages. Due to thermal noise (and/or other factors, such as component mismatch, common mode mismatch, flicker noise) in comparators associated with preamplifiers, a transition between adjacent preamplifiers (such as pre-amp 316a and pre-amp 316b) occurs over a range (or zone) and not a single transition point. With respect to pre-amp 316a and pre-amp 316b, this transition zone is depicted in FIG. 4 as overlap zone 402.

The output codes up to level x2 are generated through pre-amp 316a, and the output codes from level x3 (and greater) are generated through pre-amp 316b. In a conventional circuit, the output codes would be represented by curve 520. Thus, there a discontinuity in the transfer function at points when the output code transitions from one preamplifier to the next (adjacent) preamplifier (such as going from pre-amp 316a to pre-amp 316b). The discontinuity is a result of changes in gain and offset of preamplifiers which is due to mismatches in the paths used in calibration mode and in mission mode. The mismatches in the two paths is attributed to component mismatch, common mode mismatch, flicker noise and temperature variations. This results in errors in the look-up table in the storage circuit 108. The circuit 100 addresses this problem.

In circuit 100, the output codes would be represented by curve 510. Hence, the circuit 100 does not result in a discontinuity in the transfer function at points when the output code transitions from one preamplifier to the next (adjacent) preamplifier (such as going from pre-amp 316a to pre-amp 316b). In circuit 100, the look-up table (stored in storage circuit 108 of FIG. 1 in some example embodiments) is filled for both the pre-amp 316a and the pre-amp 316b within the overlap zone 402 as described above with reference to FIGS. 3, 4 and 5. A discontinuity parameter is estimated from the output codes generated as discussed above.

Thus, the circuit 100 addresses the issue of discontinuities in the transfer function at points when the output code transitions from one preamplifier to another preamplifier. As the discontinuity parameter is estimated from output codes generated for same set of input codes, the effect of noise is nullified. This enables the circuit 100 to be used as a low power, high performance RF sampling ADC.

Figure 6:
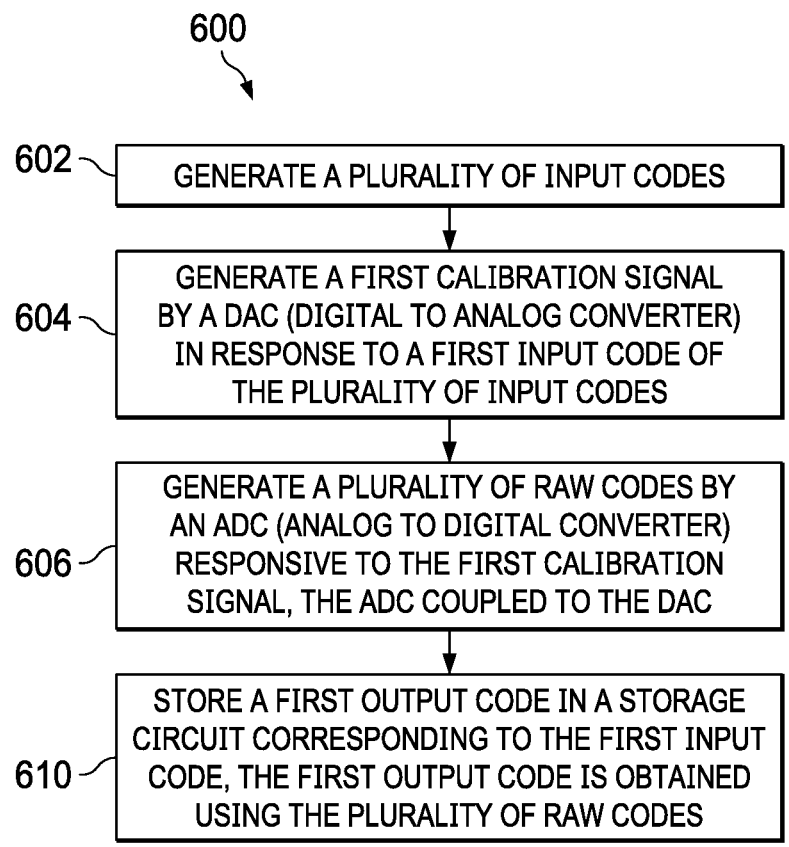
FIG. 6 is a flowchart of a method of operation of a circuit; according to an example embodiment.

FIG. 6 is a flowchart 600 of a method of operation of a circuit, according to an example embodiment. The flowchart 600 is described in connection with the circuit 100 of FIG. 1. At step 602, a plurality of input codes are generated by the calibration engine 102 in some example embodiments. In one example, the multiple input codes range from a minimum input code to a maximum input code. The multiple input codes, in another example, include a first input code and a second input code. A difference between the first input code and the second input code is where M is an integer. In one example, M is 1.

At step 604, a first calibration signal is generated by a digital to analog converter (DAC) in response to a first input code of the plurality of input codes. A plurality of raw codes are generated by an analog to digital converter (ADC) responsive to the first calibration signal, at step 606. More specifically, the DAC 104, in circuit 100, generates a first calibration signal in response to the first input code.

Step 606 continues whereby the ADC 106 operates in multiple cycles for each input code. The ADC 106 receives the first calibration signal corresponding to the first input code from the multiplexer M 112, which, in one example, is controlled by the calibration engine 102. Each pre-amplifier in the ADC 106 has a different threshold voltage. Each pre-amplifier in the preamplifier array 116 compares the first calibration signal to a threshold voltage. The delay multiplexer DM 120 generates a delay signal based on an output of one of the preamplifiers. The backend ADC generates a first raw code in response to the delay signal. The first raw code is generated by the ADC 106 in first cycle. The ADC 106, using the preamplifier array 116, the delay multiplexer DM 120 and the backend ADC 12.4 generates multiple raw codes in multiple cycles corresponding to the first input code.

At step 610, a first output code is stored, in storage circuit 108, corresponding to the first input code. The first output code is obtained using the multiple raw codes generated by the ADC 106. The first output code is average of the multiple raw codes, in one example. In another example, the first output code is a mathematical function of the multiple raw codes. In one example embodiment, the storage circuit 108 maintains a look-up table to store the first output code corresponding to the first input code. In another example embodiment, the multiple raw codes generated by the ADC 106 are stored in the calibration engine 102. The calibration engine 102 estimates the first output code from the multiple raw codes, and stores the first output code in the look-up table in the storage circuit 108 corresponding to the first input code.

The method provides the circuit to operate in mission mode. In the mission mode, the multiplexer M 112 provides the input voltage Vin 110 to the ADC 106. The multiplexer M 112 is controlled by the calibration engine 102. The ADC 106 generates a raw code in response to the input voltage Vin 110. An output code in the storage circuit 108 corresponding to the raw code is selected, and generated as a final output 130 by the circuit 100.

The method also provides that the storage circuit 108 stores a first output code corresponding to a first input code in a first location, and the second output code corresponding to a second input code is stored in a second location in the storage circuit 108. In circuit 100, when the second output code is less than a predetermined threshold, the second output code is incremented by defined bits and stored in a third location in the storage circuit 108.

The method enables the circuit 100, in calibration mode, to generate a valid output code irrespective of the preamplifier chosen (such as pre-amp 316a or pre-amp 316b). In a first scheme, the pre-amp 316a is activated. The storage circuit 108 stores M output codes corresponding to M input codes, where M is an integer. The pre-amp 316a toggles at Mth input code. The pre-amp 316a is kept active to continue processing for (L) input codes. The look-up table in the storage circuit 108 stores (L) output codes generated for (L) input codes. Thus, for pre-amp 316a, the pre-amp 316a processes (M+L) input codes, and the storage circuit 108 stores (M+L) output codes corresponding to (M+L) input codes. In another step, the pre-amp 316a is inactivated, and the pre-amp 316b is activated. The input code is changed to (M−L+1). The storage circuit 108 stores output codes generated corresponding to each input code from (M−L+1)th input code. Thus, this method ensures that the look-up table in the storage circuit 108 is filled for both the pre-amp 316a and the pre-amp 316b within the overlap zone 402.

In a second scheme, the look-up table in the storage circuit 108 is filled for both the pre-amp 316a and the pre-amp 316b within the overlap zone 406. In calibration mode, the pre-amp 316a is activated. The storage circuit 108 stores M output codes corresponding to M input codes, where M is an integer. The pre-amp 316a toggles at Mth input code. The pre-amp 316a is kept active to continue processing to (T) input codes, where the raw code saturates at the Tth input code. The look-up table in the storage circuit 108 stores (T) output codes generated for (T) input codes. Thus, while the pre-amp 316a is active, the pre-amp 316a processes (M+T) input codes, and the storage circuit 108 stores (M+T) output codes. After these values are stored, the pre-amp 316a is inactivated, and the pre-amp 316b is activated. The input code is decremented from Tth input code to Dth input code, where raw code saturates at Dth input code. The storage circuit 108 stores output codes generated corresponding to each input code from Dth input code.

The method also enables the circuit 100 to evade the errors caused in look-up table due to changes in gain and offset of preamplifiers. The changes in preamplifier gain and offset leads to discontinuities in the transfer function at points when the output code transitions from one preamplifier to another preamplifier.

The look-up table is filled for both the pre-amp 316a and the pre-amp 316b within the overlap zone 402. In calibration mode, the pre-amp 316a is activated. The storage circuit 108 stores M output codes corresponding to M input codes, where M is an integer. The pre-amp 316a toggles at Mth input code. The pre-amp 316a is kept active to continue processing to (L) input codes. The look-up table in the storage circuit 108 stores (L) output codes generated for (L) input codes. Thus, for pre-amp 316a, the pre-amp 316a processes (M+L) input codes, and the storage circuit 108 stores (M+L) output codes corresponding to (M+L) input codes. After storing these codes, the pre-amp 316a is inactivated, and the pre-amp 316b is activated. The input code is changed to (M−L+1). The storage circuit 108 stores output codes generated corresponding to each input code starting from (M−L+1)th input code.

A discontinuity parameter is estimated from the output codes generated through the first preamplifier from Mth input code to (M+L)th input code and the output codes generated through the second preamplifier from (M−L+1)th input code to the Mth input code. In one example, a first mean of the output codes generated through the first preamplifier from Mth input code to (M+L)th input code is estimated. Also, a second mean of the output codes generated through the second preamplifier from (M−L+1)th input code to the Mth input code is estimated. The discontinuity parameter is estimated from a difference of the first mean and the second mean. The discontinuity parameter is added to the output codes generated through the second preamplifier and successive preamplifiers, when the discontinuity parameter is greater than a first threshold. This discontinuity parameter estimation and subsequent correction is performed for every preamplifier crossing.

The method enables a circuit, for example circuit 100, to be used as a high speed and high performance ADC. The method is advantageous when the ADC 106 is a non-linear ADC or is a delay-based ADC. In calibration mode, the look-up table in the storage circuit 108 is populated, and in mission mode, the method enables the circuit 100 to use a high speed ADC 106 and the storage circuit 108 to generate an output code corresponding to the input voltage Vin 110. Hence, the method does not use any complex algorithms or hardware for digital conversion of the input voltage Vin 110. This reduces the area and power requirements of the circuit 100. Thus, the method enables the circuit 100 to be used in RF sampling receivers which operate at speeds of GSPS.

Figure 7:
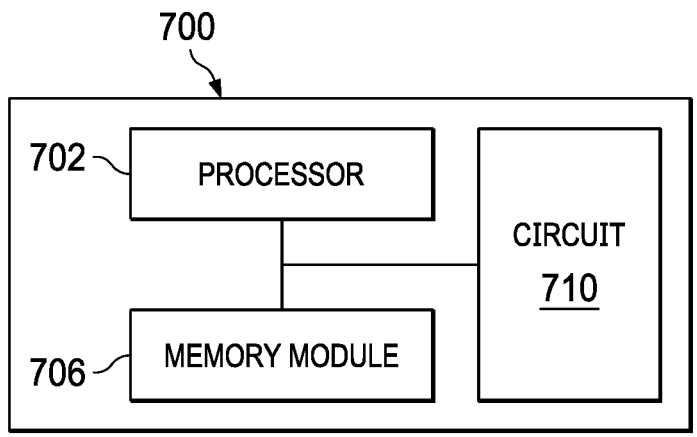
FIG. 7 is a block diagram of an example device in which several aspects of example embodiments can be implemented.

FIG. 7 is a block diagram of an example device 700 in which several aspects of example embodiments can be implemented. The device 700 is, or in incorporated into or is part of, a server farm, a vehicle, a communication device, a transceiver, a personal computer, a gaming platform, a computing device, or any other type of electronic system. The device 700 may include one or more conventional components that are not described herein for simplicity of the description.

In one example, the device 700 includes a processor 702 and a memory module 706. The processor 702 can be a CISC-type (complex instruction set computer) CPU, RISC-type CPU (reduced instruction set computer), a digital signal processor (DSP), a processor, a CPLD (complex programmable logic device) or an FPGA (field programmable gate array).

The memory module 706 (which can be memory such as RAM, flash memory, or disk storage) stores one or more software applications (e.g., embedded applications) that, when executed by the processor 702, performs any suitable function associated with the device 700.

The processor 702 may include memory and logic, which store information frequently accessed from the memory module 706. The device 700 includes a circuit 710. In one example, the processor 702 may be placed on the same printed circuit board (PCB) or card as the circuit 710. In another example, the processor 702 is external to the device 700. The circuit 710 can function as an analog to digital converter.

The circuit 710 is similar, in connection and operation, to the circuit 100 of FIG. 1. The circuit 710 includes a calibration engine, a digital to analog converter (DAC), an analog to digital converter (ADC), a multiplexer and a storage circuit. The multiplexer receives an input voltage Vin. The ADC includes a preamplifier array, a delay multiplexer, a backend ADC and a preamplifier selection block. The preamplifier array includes multiple preamplifiers.

The circuit 710 operates in a calibration mode and a mission mode. In calibration mode, the calibration engine 102 generates multiple input codes. In one example, the multiple input codes range from a minimum input code to a maximum input code. The multiple input codes, in another example, include a first input code and a second input code. A difference between the first input code and the second input code is M, where M is an integer. In one example, M is 1. The DAC generates a first calibration signal in response to the first input code. The multiplexer, in calibration mode, provides the first calibration signal to the ADC, The ADC generates multiple raw codes in response to the first calibration signal.

The storage circuit stores a first output code corresponding to the first input code. The first output code is obtained using the multiple raw codes generated by the ADC. The first output code is average of the multiple raw codes, in one example. In another example, the first output code is a mathematical function of the multiple raw codes. In one version, the storage circuit maintains a look-up table to store the first output code corresponding to the first input code. In another version, the multiple raw codes generated by the ADC are stored in the calibration engine. The calibration engine estimates the first output code from the multiple raw codes, and stores the first output code in the look-up table in the storage circuit corresponding to the first input code.

In the mission mode, the multiplexer provides the input voltage Vin to the ADC. The multiplexer is controlled by the calibration engine. The ADC generates a raw code in response to the input voltage Vin. An output code in the storage circuit corresponding to the raw code is selected, and generated as a final output by the circuit 710.

The circuit 710, in one version, is advantageous when the ADC 106 is a non-linear ADC or is a delay-based ADC. In calibration mode, the look-up table in the storage circuit is populated, and in mission mode, the circuit 710 uses high speed ADC and the storage circuit to generate an output code corresponding to the input voltage Vin. Hence, the circuit 710 does not use any complex algorithms or hardware for digital conversion of input voltage Vin. This reduces the area and power requirements of the circuit 710. Thus, circuit 710 is capable of being used in RF sampling receivers which operate at speeds of GSPS.

Figure 8:
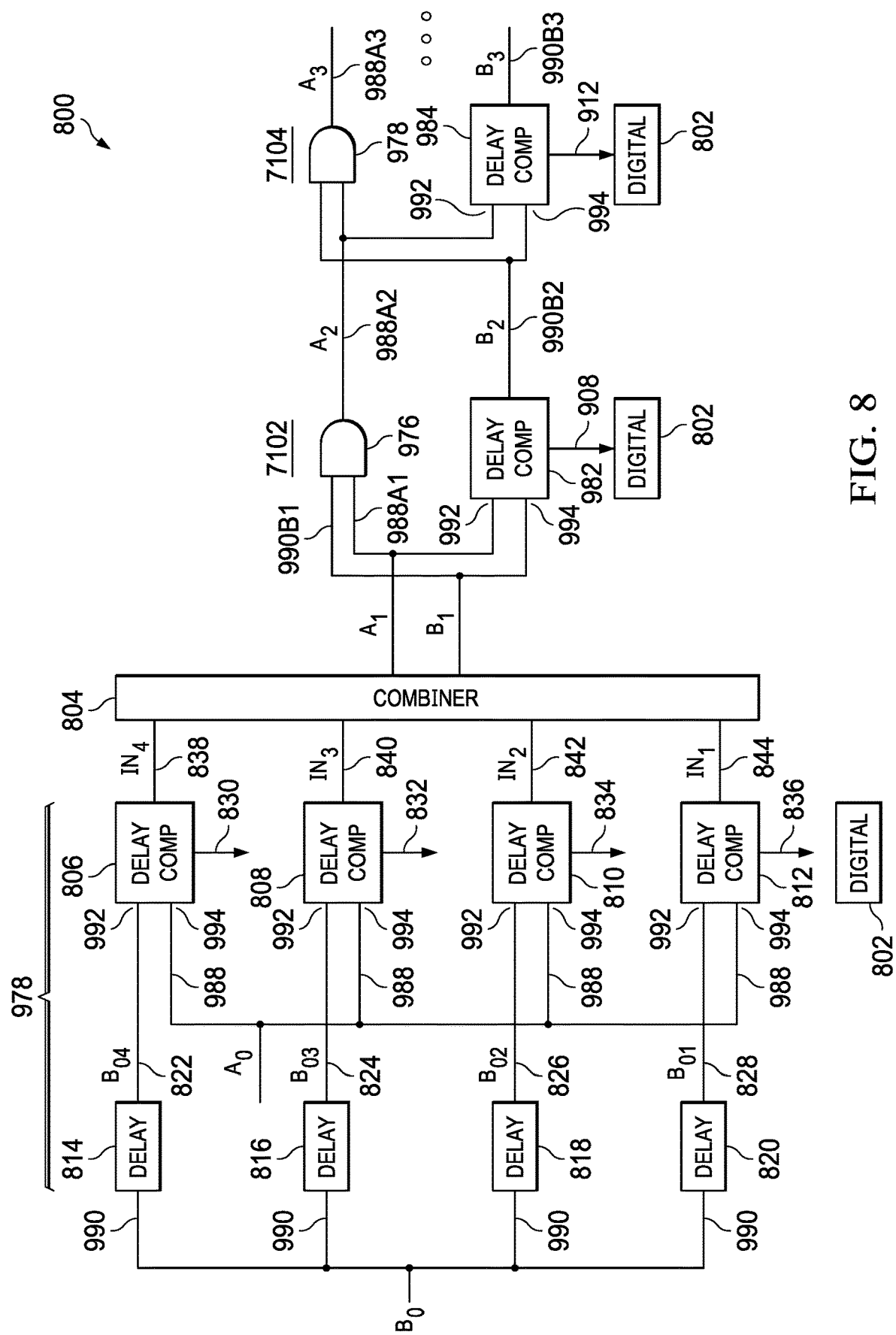
FIG. 8. is a block diagram of a backend analog-to-digital converter, according to an example embodiment.

FIG. 8. is a block diagram of a backend analog-to-digital converter 800, according to an example embodiment. The backend ADC 800 is similar, in connection and operation, to backend ADC 124 illustrated in FIG. 1. The ADC 106 illustrated in FIG. 1 has a frontend and a backend. The frontend may perform a voltage-to-delay function. In one example, the frontend includes a preamplifier array and a delay multiplexer as illustrated in FIG. 3. The backend may perform a delay-to-digital function. According to one aspect of the present disclosure, the frontend of the ADC 106 converts the analog signal Vin received from multiplexer M 112 into delay signals similar to the signals OUT_P and OUT_M generated in FIG. 3. In FIG. 8, these delay signals are represented as A0 and B0 on lines 988 and 990, such that the timings of the delay signals A0 and B0 are representative of the input voltage Vin. The front end, which may be used to generate the delay signals A0 and B0 based on the input voltage Vin, may be constructed and operated, for example, as described in U.S. Pat. No. 10,673,456 (based on U.S. patent application Ser. No. 16/410,698). The frontend may include, for example, a conversion and folding circuit described in U.S. Pat. No. 10,673,456, which includes a voltage-to-delay converter block, including preamplifiers, for converting a voltage signal into delay signals, and a folding block, including logic gates coupled to the preamplifiers, for selecting earlier-arriving and later-arriving ones of the delay signals.

Examples of voltage-to-delay devices which may be incorporated within the frontend of the ADC 106, and used to generate the delay signals A0 and B0 based on the input voltage Vin, are illustrated in U.S. patent application Ser. No. 17/131,981, filed Dec. 23, 2020. A voltage-to-delay device constructed in accordance with U.S. patent application Ser. No. 17/131,981 may have, for example, first and second comparators connected to first and second lines carrying complementary voltages representative of the input voltage Vin, for generating first and second output signals during an active phase when the complementary voltages reach a suitable threshold voltage, such that delay between the output signals is representative of the input voltage Vin. The present disclosure is not limited, however, to the devices and processes described in detail herein. Other suitable devices may perform a suitable voltage-to-delay function within the frontend of the ADC 106. As noted above, the entire disclosures of U.S. Pat. No. 10,673,456 and U.S. patent application Ser. No. 17/131,981 are incorporated herein by reference.

The backend ADC 800 may have, for example, a multi-bit stage 978, and first through i-th single-bit stages 7102 and 7104 connected in series to the multi-bit stage 978. If desired, the backend may have three, four or more than four such single-bit stages (i=3, 4 or more). The single-bit stages 7102 and 7104 illustrated in FIG. 8 are examples of successive non-linear stages. The backend ADC 800 receives the delay signals A0 and B0 from a voltage-to-delay circuit of the frontend. The timings of the delay signals A0 and B0 have a delay which is representative of the input voltage Vin. The backend ADC 800 works with a calibration engine 802 (similar to the calibration engine 102 illustrated in FIG. 1) to generate a corresponding multi-bit digital code which is generated as final output 130 (FIG. 1). Thus, the final output 130 corresponds to a value which closely approximates the input voltage Vin.

The multi-bit stage 978 may have delay circuits and delay comparators, operated in parallel, for generating M bits of digital information, on lines 830, 832, 834 and 836. In the illustrated example, M=2. However, M may be greater than 2. This disclosure is not limited to the illustrated example. Delay residue from the multi-bit stage 978 may be combined by a combiner 804 and applied to the first single-bit stage 7102. If desired, the first through i-th single-bit stages 7102 and 7104 may be constructed and operated as successive stages, to provide respective bits of digital information to the calibration engine 802.

The first stage 978 may have, for example, four delay comparators 806, 808, 810 and 812, and is connected to the combiner 804. Some example embodiment may be implemented with a first stage which has fewer or more than four delay comparators. In the example embodiment shown in the drawings, the first stage 978 generates two bits of digital information for the calibration engine 802. In the illustrated embodiment, each one of the successive stages 7102 and 7104 generates a single bit of digital information for the calibration engine 802.

In the illustrated example, the leading edge of the signal B0 on line 990 precedes the leading edge of the signal A0 on line 988. The first signal A0 is applied to threshold inputs 994 of the delay comparators 806, 808, 810 and 812. In the illustrated configuration, by way of example, the delay comparators 806, 808, 810 and 812 are essentially identical to each other. The second signal B0 is applied to four different delay circuits 814, 816, 818 and 820 which generate four corresponding signals B04, B03, B02 and B01 on respective lines 822, 824, 826 and 828.

The timings of the corresponding signals B04, B03, B02 and 1301 are delayed relative to the timing of the signal B0 on line 990 by different, known amounts each of which is less than or equal to the maximum gain of the frontend. The delayed signals B04, B03, B02 and B01 are applied to first inputs 892 of the respective delay comparators 806, 808, 810 and 812. The first delay comparator 806 issues a sign signal on line 830 representative of which signal (B04 or A0) arrives at the first delay comparator 806 first. Likewise, the second delay comparator 808 issues a sign signal on line 832 representative of which signal (B03 or A0) arrives at the second delay comparator 808 first. Likewise, the third and fourth delay comparators 810 and 812 issue sign signals on lines 834 and 836 representative of which signals arrive at the third and fourth delay comparators 810 and 812 first.

Since the delay circuits 814, 816, 818 and 820 are different from each other, the timings of the leading edges of the delayed signals B04, B03, B02 and B01 are different from each other. Each one of the delay comparators 806, 808, 810 and 812 issues a sign signal, on respective digital lines 830, 832, 834 and 836, to the calibration engine 802. The sign signals on lines 830, 832, 834 and 836 are functionally related to the difference in timing between the leading edges of the input signals A0 and B0 and are therefore functionally related to the input voltage Vin.

Since the amounts of delay provided by the four delay comparators 806, 808, 810 and 812 are different from each other, the sign signals 830, 832, 834 and 836 provide four binary data points for determining two bits of the output. For example, if B0 precedes A0, and B01 precedes A0, then the calibration engine 802 determines that the delay between the timings of signals A0 and B0 is greater than the delay contributed by the fourth delay circuit 820, Likewise, if B0 precedes A0, and A0 precedes B02, B03 and B04 then the calibration engine 802 determines that the delay between the timings of signals A0 and B0 is less than each of the delays contributed by the third, second and first delay circuits 818, 816 and 814.

If desired, the structure and operation of the delay comparators 806, 808, 810 and 812 may be the same as those of a delay comparator 982 described below. In operation, the delay comparators 806, 808, 810 and 812 generate respective delay signals IN4, IN3, IN2 and IN1 on respective output lines 838, 840, 842 and 844. The delay signals IN4, IN3, IN2 and IN1 are applied to the combiner 804 by the output lines 838, 840, 842 and 844, In the illustrated configuration, the delay circuits 814, 816, 818 and 820 are different from each other and contribute different amounts of delay, while the delay comparators 806, 808, 810 and 812 are essentially the same. Therefore, the timings of the leading edges of the delay signals IN4, IN3, IN2 and IN1 are different from each other.

Figure 9:
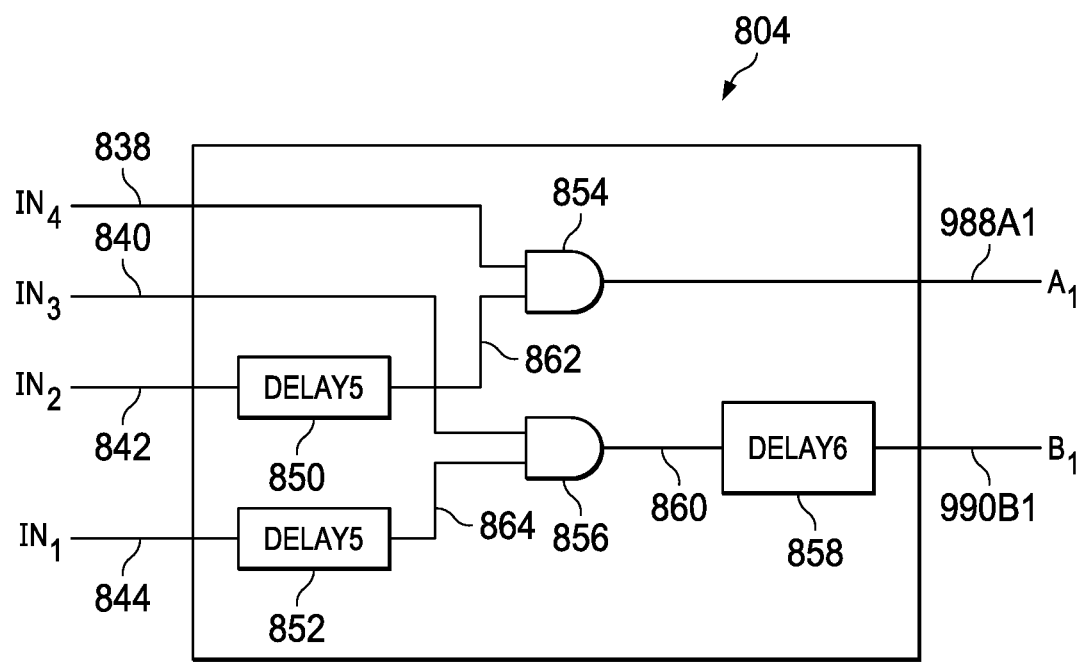
FIG. 9 is a block diagram of a combiner for connecting a multi-bit stage shown in FIG. 8 to a first one of single-bit stages, according to an example embodiment.

FIG. 9 is a block diagram of a combiner 804 for connecting a multi-bit stage shown in FIG. 8 to a first one of single-bit stages, according to an example embodiment. The combiner 804 has two fifth delay circuits 850 and 852, two AND gates 854 and 856, and a sixth delay circuit 858. In the illustrated configuration, the fifth delay circuits 850 and 852 are essentially identical to each other. However, this disclosure is not limited to the details of the configurations shown and described herein. The third and fourth delay signals IN2 and IN1 are applied to the fifth delay circuits 850 and 852, on conductive lines 842 and 844, and the first and second delay signals IN4 and IN3 are applied to the AND gates 854 and 856, on conductive lines 838 and 840. Output signals from the fifth delay circuits 850 and 852 are also applied to the AND gates 854 and 856, on conductive lines 862 and 864, respectively. An output signal from one of the AND gates 856 is applied to the sixth delay circuit 858, on a conductive line 860, and the other AND gate 854 generates a signal A1 on conductive line 988A1. The sixth delay circuit 858 generates a signal B1 on conductive line 990B1.

In operation, the timings of the leading edges of the signals output from the fifth and sixth delay circuits 850, 852 and 858 on conductive lines 862, 864 and 990, are delayed relative to the respective timings of the leading edges of the signals input to the delay circuits 850, 852 and 858. The timings of the leading edges of signals output from the AND gates 854 and 856, on lines 988A1 and 860, correspond to the respective timings of the later-arriving of the signals input to the AND gates 854 and 856. The relative timing of the leading edges of the signals A1 and B1 on lines 988A1 and 990B1 is functionally (that is, predictably) related to the input voltage Vin (FIG. 1). In other words, the delay circuits 850, 852 and 858 and the logic gates 854 and 856 establish a transfer function between the delay of the incoming signals IN4, IN3, IN2 and IN1 and the delay of the first and second signals A1 and B1.

For the illustrated configuration, the transfer function is as follows: [A] if the timing of the signal on line 838 precedes the timing of the signal on line 862 (where the timing of the signal on line 862 corresponds to the timing of the signal on line 842 delayed by the fifth delay circuit 850); then the timing of the signal on line 988A1 corresponds to the timing of the signal on line 862, but if the timing of the signal on line 862 precedes the timing of the signal on line 838, then the timing of the signal on line 988A1 corresponds to the timing of the signal on line 838; [B] if the timing of the signal on line 840 precedes the timing of the signal on line 864 (where the timing of the signal on line 864 corresponds to the timing of the signal on line 844 delayed by the fifth delay circuit 852), then the timing of the signal on line 860 corresponds to the timing of the signal on line 864, but if the timing of the signal on line 864 precedes the timing of the signal on line 840, then the timing of the signal on line 860 corresponds to the timing of the signal on line 840; and [C] the timing of the signal on line 990B1 corresponds to the timing of the signal on line 860 delayed by the sixth delay circuit 858.

The amounts by which the delay elements 850; 852 and 858 delay the signals transmitted through them may be selected to maximize or improve the gain of the first and second signals A1 and B1 to the extent practicable. The combiner 804 operates in delay mode, where gain relates to delay (not voltage). If the gain of the first and second signals A1 and B1 is too low, meaning that the timings of the first and second signals A1 and B1 are too close to each other, then the information represented by the relative timing of those signals may be difficult to resolve.

One aspect of the present disclosure is that the timings of the signals on lines 988A1 and 990B1 are functionally (that is, predictably) related to the timings of the signals on lines 838, 840; 842 and 844. If a certain set of signal timings on lines 838, 840; 842 and 844 results in a first set of signal timings on lines 988A1 and 990B1, the same first set of signal timings on lines 988A1 and 990B1 may be expected to occur whenever the same set of signal timings occurs on lines 838, 840, 842 and 844. Likewise, if another set of signal timings on lines 838, 840, 842 and 844 results in a second set of signal timings on lines 988A1 and 990B1, the same second set of signal timings on lines 988A1 and 990B1 may be expected to occur whenever the other set of signal timings occurs on lines 838, 840, 842 and 844. And since the timings of the signals on lines 838, 840, 842 and 844 are functionally (that is, predictably) related to the input voltage Vin, the timings of the signals on lines 988A1 and 990B1 are also functionally related to the input voltage Vin.

Referring again to FIG. 8, the signals A1 and B1 generated by the combiner 804 are applied to the second stage 7102 on the output lines 988A1 and 990B1. The second stage (which is a first residual stage) 7102 is coupled to the first stage 978 (through the combiner 804), and the i-th stage 7104 (which is a second residual stage in the illustrated example) is coupled to the second stage 7102.

In the illustrated example, the second through i-th stages 7102 and 7104 each include AND gates (such as AND gate 976 for stage 7102 and AND gate 978 for stage 7104) and delay comparators (such as delay comparator 982 for stage 7102 and delay comparator 984 for stage 7104), The illustrated AND gates are merely examples, however, of logic gates that may be employed according to this disclosure. If desired, this disclosure may be implemented with or without AND gates and/or with or without gates other than AND gates.

Further, in the illustrated configuration, the AND gates 976 and 978 may be essentially identical to each other, and the delay comparators 982 and 984 may be essentially identical to each other. The conductive output lines 988A1 and 990B1 from the combiner 804 are coupled to inputs of the first AND gate 976 and delay comparator 982. Specifically, the conductive line 988A1 is coupled to a first input 992 of the delay comparator 982, and the conductive line 990B1 is coupled to a threshold input 994 of the delay comparator 982.

An output line 988A2 from the AND gate 976 is electrically coupled to one of the inputs of the AND gate 978, and to the input 992 of the delay comparator 984. A conductive line 990B2 from the first delay comparator 982 is electrically coupled to the other one of the inputs of the AND gate 978, and to the threshold input 994 of the delay comparator 984. The pattern created by the second and third stages 7102 and 7104 may be continued for as many additional stages as desired. Each successive stage has an AND gate and a delay comparator essentially identical to the AND gates and the delay comparators of the second and third stages 7102 and 7104, and is electrically coupled to the ANI) gate and delay comparator of a preceding stage in the same way.

In operation, signals AN and BN (where N=1, 2, 3 . . . for stages 7102 and 7104 . . . respectively) are applied to respective ones of the AND gates 976 and 978, causing the AND gates 976 and 978 to generate corresponding signals AN+1, For each one of the AND gates 976 and 978, the timing of the leading edge of signal AN+1 tracks the timing of the leading edge of the later-arriving of signals AN and BN. In particular, for each one of the AND gates 976 and 978, the timing of the leading edge of signal AN+1 is equal to the timing of the leading edge of the earlier-arriving of signals AN and BN plus an amount of time that is related to the extent to which the leading edge of the later-arriving of signals AN and BN lags behind the leading edge of the earlier-arriving of signals AN and BN.

Figure 10:
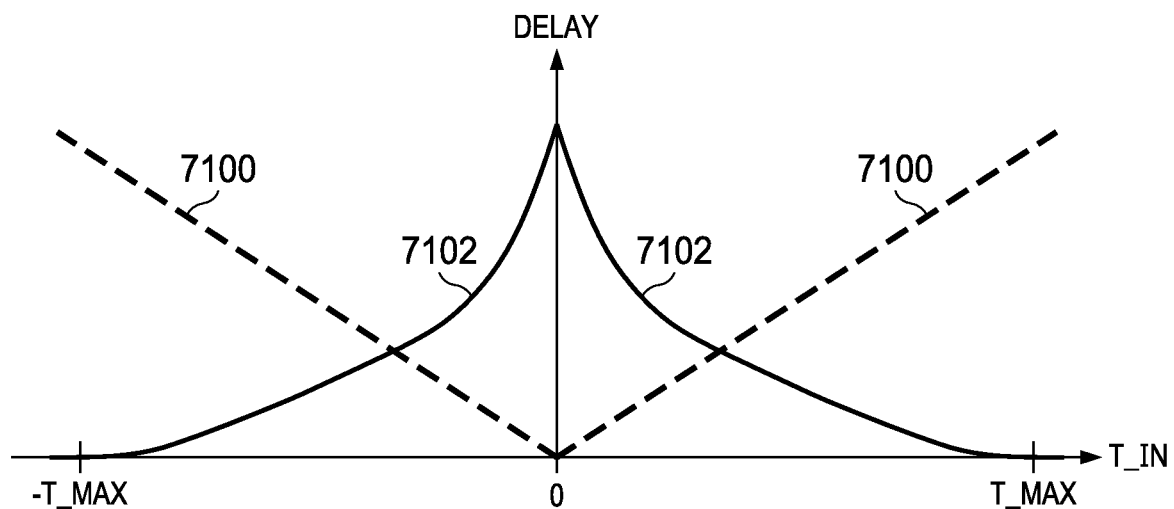
FIG. 10 is a graph which illustrates AND-gate delay and comparator delay generated by an AND gate and a delay comparator; respectively, of the backend ADC of FIG. 8; where the AND-gate delay and the comparator delay are functions of input-signal delay, according to an example embodiment.

FIG. 10 is a graph which illustrates AND-gate delay and comparator delay generated by an AND gate and a delay comparator, respectively, of the backend ADC of FIG. 8, where the AND-gate delay and the comparator delay are functions of input-signal delay, according to an example embodiment. As illustrated in FIG. 10, the AND-gate delay 7100 contributed by a respective AND gate is linearly related to the absolute value of an input-signal delay T_IN, where the input-signal delay T_IN is the difference in timing between signals AN and BN input into the respective AND gate. In the illustrated configuration, the relationship of the AND gate delay 7100 to the input-signal delay T_IN is linear regardless of whether AN or BN leads or follows.

Signals AN and BN are also applied to the inputs 992 and threshold inputs 994, respectively, of the delay comparators 982 and 984, causing the delay comparators 982 and 984 to generate corresponding signals BN+1. For each one of the delay comparators 982 and 984, the timing of the leading edge of signal BN+1 tracks the timing of the leading edge of the earlier-arriving of signals AN and BN. In particular, for each one of the delay comparators 982 and 984, the timing of the leading edge of signal BN+1 is equal to (1) the timing of the leading edge of the earlier-arriving of signals AN and BN plus (2) a comparator delay 7102 that is logarithmically inversely related to the absolute value of the input-signal delay T_IN (in other words, comparator delay is greater for input values that are more similar—if the difference between the two inputs to the comparator is greater, the comparator delay is less).

Figure 11:
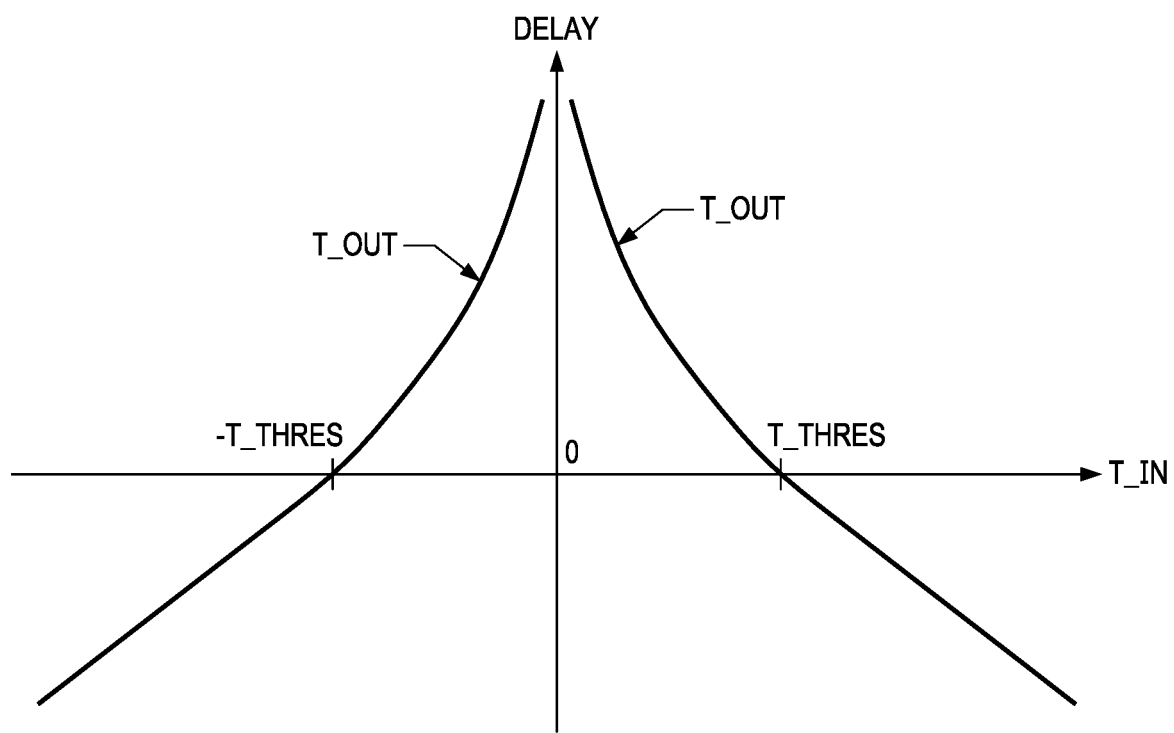
FIG. 11 is a graph which illustrates output-signal delay as a function of the input-signal delay of FIG. 10, according to an example embodiment.

FIG. 11 is a graph which illustrates output-signal delay as a function of the input-signal delay of FIG. 10, according to an example embodiment. Subtracting the AND gate-delay 7100 from the comparator delay 7102 yields the output-signal delay T_OUT for any given single-bit stage 7102 and 7104. When the absolute value of the input-signal delay T is less than a threshold delay T_THRES, then the output-signal delay T_OUT is a positive value (meaning that the leading edge of signal BN+1 generated by the respective delay comparator 982 and 984 precedes the leading edge of signal AN+1 generated by the respective AND gate 976 and 978). On the other hand, when the absolute value of the input-signal delay TIN is greater than the threshold delay T_THRES, then the output-signal delay T_OUT is a negative value (meaning that the leading edge of signal BN+1 lags behind the leading edge of corresponding signal AN+1). The positive or negative character of the output-signal delay T_OUT is reported to the calibration engine 802 on the signal line of the successive delay comparator.

In operation, the first delay comparator 982 issues a first sign signal ("1" or "0") on digital line 408 (an example of a digital output) to the calibration engine 802. The first sign signal (an example of a digital signal in accordance with this disclosure) is based on which one of the leading edges of signals A1 and B1 is first received by the first delay comparator 982, such that the first sign signal reflects the order of the leading edges of signals A1 and B1 applied to the first input 992 and threshold input 994 of the delay comparator 982. The AND gate 976 and the delay comparator 982 generate signals A2 and B2 which are applied to the AND gate 978 and the delay comparator 984 of the third stage 104. The delay comparator 984 outputs a second sign signal ("1" or "0") on a second digital line 912 to the calibration engine 802. The second sign signal is based on which one of the leading edges of the signals A2 and B2 is first received by the second delay comparator 984, such that the second sign signal reflects the order of the leading edges of the signals A2 and B2 applied to the inputs 992 and 994 of the second delay comparator 984.

Since the delay between signals A1 and B1 can be predicted as a function of the input voltage Vin, and vice versa, and since the delay between the signals AN+1 and BN+1 output by a successive stage can be predicted as a function of the signals AN and BN received from the preceding stage, and vice versa, the sign signals output by the delay comparators of the cascade of stages can be predicted as a function of the input voltage Vin, and vice versa. Therefore, a code made up of the sign signals may be reliably compared to a predetermined correlation to determine an approximation of the input voltage Vin. In operation, the timings of the signals on lines 988A1 and 990B1 are functionally (that is, predictably) related to the timings of the signals on lines 988 and 990, as discussed above. The timings of the signals on lines 988A2 and 990B2 are functionally (that is, predictably) related to the timings of the signals on lines 988A1 and 990B1. The timings of the signals on lines 988A3 and 990B3 are functionally (that is, predictably) related to the timings of the signals on lines 988A2 and 990B2, and so on.

Moreover, where a certain set of signal timings on lines 988 and 990 results in a first set of signal timings on lines 988A1, 990B1, 988A2, 990B2, 988A3, 990B3, and so on, the same first set of signal timings on lines 988A1, 990B1, 988A2, 990B2, 988A3, 990B3, and so on may be expected to occur whenever the same set of signal timings occurs on lines 988 and 990. Likewise, if another, different set of signal timings on lines 988 and 990 results in a second set of signal timings on lines 988A1, 990B1, 988A2, 990B2, 988A3, 990B3, and so on, the same second set of signal timings on lines 988A1, 990B1, 988A2, 990B2, 988A3, 990B3, and so on may be expected to occur whenever the other set of signal timings occurs on lines 988 and 990. And since the timings of the signals on lines 988 and 990 are functionally (that is, predictably) related to the input voltage Vin, the timings of the signals on lines 988A1, 990B1, 988A2, 990B2, 988A3, 990B3, and so on, which determine the sign signals used to make up the output code, are also functionally related to the input voltage Vin.

Figure 12:
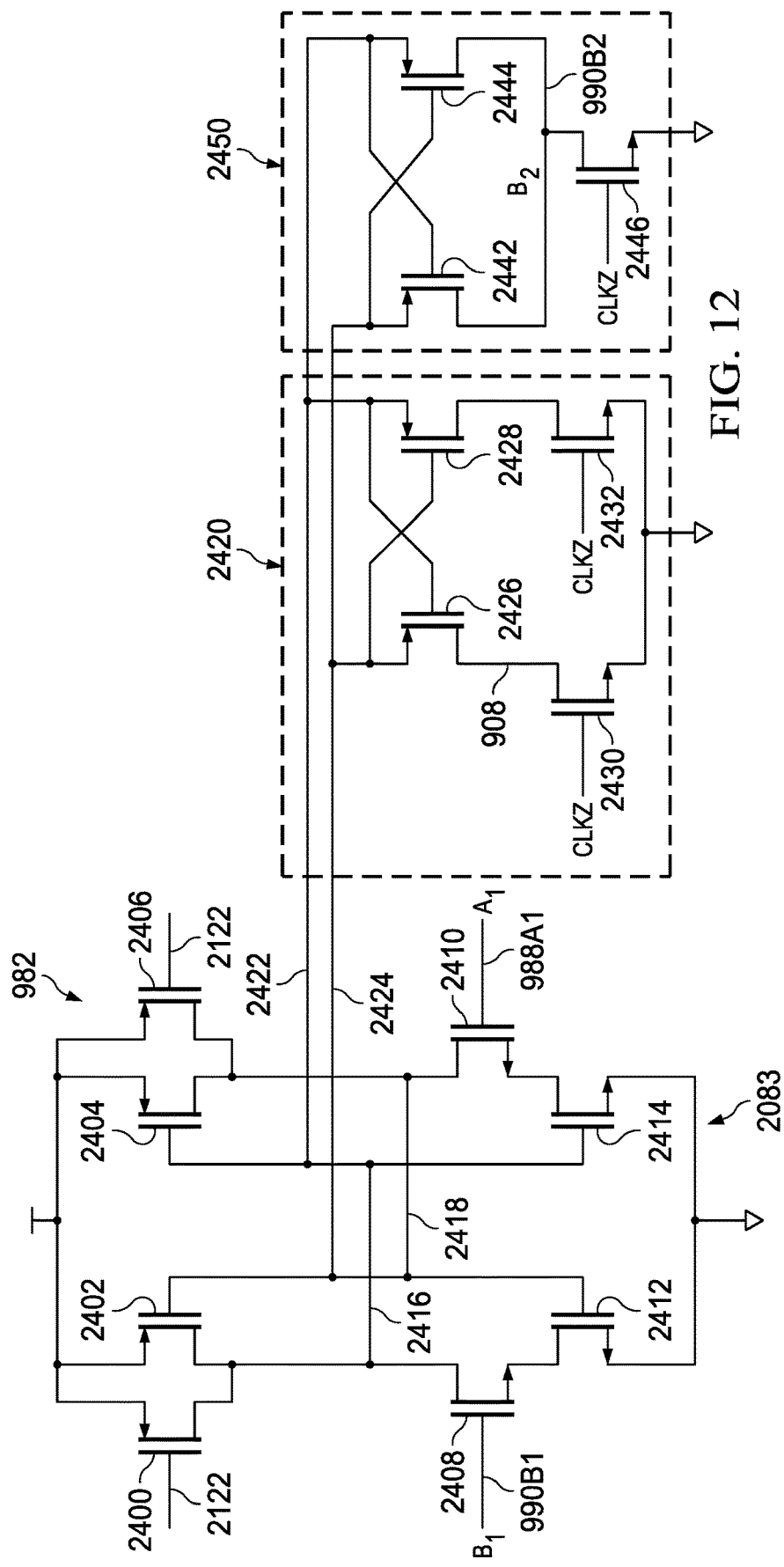
FIG. 12 is a circuit diagram of an example of a comparator circuit merged with sign-out and delay-out circuits for the backend ADC of FIG. 8, according to an example embodiment.

FIG. 12 is a circuit diagram of an example of a comparator circuit merged with sign-out and delay-out circuits for the backend ADC of FIG. 8, according to an example embodiment. The delay comparator 982 has a comparator circuit 2083 which has first, second, third, fourth, fifth, sixth, seventh, and eighth transistors 2400, 2402, 2404, 2406, 2408, 2410, 2412 and 2414. In the illustrated example, the timing of the delay comparator 982 is controlled by a signal from a clock (CLK) applied to the gates of the first and fourth transistors 2400, 2406, on a conductive line 2122. The first and second signals A1, B1 on lines 988A1 and 990B1 are applied to the gates of the sixth and fifth transistors 2410 and 2408, respectively. The drains of the first, second, and fifth transistors 2400, 2402 and 2408 are electrically connected to each other, and to the gates of the third and eighth transistors 2404 and 2414, via a first conductive line 2416. The drains of the third, fourth, and sixth transistors 2404, 2406 and 2410 are likewise electrically connected to each other, and to the gates of the second and seventh transistors 2402 and 2412, via a second conductive line 2418.

The first and second conductive lines 2416 and 2418 of the comparator circuit 2083 are electrically connected to a sign-out circuit 2420 via respective third and fourth conductive lines 2422 and 2424. As illustrated, the sign-out circuit 2420 is merged with the comparator circuit 2083. The sign-out circuit 2420 has first, second, third and fourth transistors 2426, 2428, 2430 and 2432. The third conductive line 2422 is electrically connected to the gate and the source of the first and second transistors 2426 and 2428 of the sign-out circuit 2420, respectively, while the fourth conductive line 2424 is electrically connected to the source and the gate of the first and second transistors 2426 and 2428 of the sign-out circuit 2420, respectively.

In operation, when the delay comparator 982 is enabled by the clock signal on line 2122, a sign signal is generated within the sign-out circuit 2420 on line 908. The sign signal is forwarded to the calibration engine 802 on line 908, and represents the order in which the output signals A1 and B1 arrive at the first and threshold inputs 992 and 994 of the delay comparator 982. The operation of the sign-out circuit 2420 is controlled by an inverted clock signal CLKZ applied to the gates of the third and fourth transistors 2430 and 2432 of the sign-out circuit 2420. The inverted clock signal CLKZ is an inverted version of the clock signal that is applied to the gates of the first and fourth transistors 2400 and 2406 of the comparator circuit 2083 on line 2122.

The third and fourth conductive lines 2422 and 2444 are also electrically connected to a delay-out circuit 2450. As illustrated, the delay-out circuit 2450 is merged with the comparator circuit 2083. The delay-out circuit 2450 has first, second and third transistors 2442, 2444 and 2446. The third conductive line 2422 is electrically connected to the gate and the source of the first and second transistors 2442 and 2444 of the delay-out circuit 2450, respectively, while the fourth conductive line 2424 is electrically connected to the source and the gate of the first and second transistors 2442 and 2444 of the delay-out circuit 2450, respectively.

In operation, a delay signal B2 is generated on line 990B2 which is electrically, connected to the drains of both of the first and second transistors 2442 and 2444 of the delay-out circuit 2450. The timing of the leading edge of the delay signal B2 on line 990B2 relative to the timing of the earlier-arriving of the leading edges of the signals A1 and B2 on inputs 992 and 994 is the comparator delay 7102. The operation of the delay-out circuit 2450 is controlled by the same inverted clock signal CLKZ that is applied to the third and fourth transistors 2430, 2432 of the sign-out circuit 2420. The inverted clock signal CLKZ is applied to the gate of the third transistor 2446 of the delay-out circuit 2450. The drain of the third transistor 2446 of the delay-out circuit 2450 is electrically connected to the drains of the first and second transistors 2442, 2444 of the delay-out circuit 2450.

The term "couple" is used throughout. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described embodiments, and other embodiments are possible, within the scope of the claims.

What is claimed is:

1. A circuit comprising:
   a calibration engine configured to generate a plurality of input codes;
   a digital to analog converter (DAC) coupled to the calibration engine, and configured to generate a first calibration signal in response to a first input code of the plurality of input codes;
   an analog to digital converter (ADC) coupled to the DAC and configured to generate a plurality of raw codes responsive to the first calibration signal; and
   a storage circuit coupled to the ADC and configured to store a first output code corresponding to the first input code, the first output code is obtained using the plurality of raw codes generated by the ADC.

2. The circuit of claim 1, wherein the calibration engine is configured to store the plurality of raw codes corresponding to the first input code, and the first output code stored in the storage circuit is average of the plurality of raw codes.

3. The circuit of claim 1, wherein the plurality of input codes includes the first input code and a second input code, and a difference between the first input code and the second input code is M, where M is an integer.

4. The circuit of claim 3 wherein the first output code corresponding to the first input code is stored in a first location in the storage circuit, and a second output code corresponding to the second input code is stored in a second location in the storage circuit.

5. The circuit of claim 4, wherein when the second output code is less than a predetermined threshold, the second output code is incremented by defined bits and stored in a third location in the storage circuit.

6. The circuit of claim 1 further comprising a multiplexer coupled to the DAC and configured to provide one of an input voltage and the first calibration signal to the ADC.

7. The circuit of claim 6, wherein the ADC further comprises:
   a plurality of preamplifiers, each preamplifier configured to compare one of the input voltage and the first calibration signal to a threshold voltage;
   a delay multiplexer coupled to the plurality of preamplifiers and configured to generate a delay signal based on an output of one of the preamplifiers; and
   a backend ADC configured to generate a first raw code in response to the delay signal.

8. The circuit of claim 6, wherein each preamplifier has a different threshold voltage.

9. The circuit of claim 8 configured to operate in a mission mode, wherein in the mission mode:
   the multiplexer is configured to provide the input voltage; and
   the ADC is configured to generate a raw code in response to the input voltage, wherein an output code in the storage circuit corresponding to the raw code is generated as a final output.

10. The circuit of claim 8, wherein the plurality of preamplifiers includes a first preamplifier and a second preamplifier, the first and second preamplifiers have successive threshold voltages.

11. The circuit of claim 10, wherein:
    the first preamplifier is activated;
    the storage circuit is configured to store M+L output codes corresponding to M+L input codes processed through the first preamplifier, the first preamplifier toggles at Mth input code, and M and L are positive integers;
    the first preamplifier is inactivated and the second preamplifier is activated;
    the input code is changed to M−L+1; and
    the storage circuit is configured to store output codes corresponding to each input code from (M−L+1)th input code processed through the second preamplifier.

12. The circuit of claim 10, wherein:
    the first preamplifier is activated;
    the storage circuit is configured to store M+T output codes corresponding to M+T input codes processed through the first preamplifier, the first preamplifier toggles at Mth input code and the raw code saturates at Tth input code;
    the first preamplifier is inactivated and the second preamplifier is activated;
    the input code is decremented from Tth input code to Dth input code, wherein the raw code saturates at Dth input code, where M, T and D are integers; and
    the storage circuit is configured to store output codes corresponding to each input code from Dth input code.

13. The circuit of claim 10, wherein:
    the first preamplifier is activated;
    the storage circuit is configured to store M+L output codes corresponding to M+L input codes processed through the first preamplifier, the first preamplifier toggles at Mth input code, and M and L are integers;
    the first preamplifier is inactivated and the second preamplifier is activated;

the input code is changed to M−L+1;

the storage circuit is configured to store output codes corresponding to each input code from (M−L+1)th input code processed through the second preamplifier;

a discontinuity parameter is estimated from the output codes generated through the first preamplifier from Mth input code to Lth input code and the output codes generated through the second preamplifier from Lth input code to the Mth input code; and the discontinuity parameter is added to output codes generated through the second and successive preamplifiers, when the discontinuity parameter is greater than a first threshold.

14. A method of calibration comprising:

generating a plurality of input codes;

generating a first calibration signal by a digital to analog converter (DAC) in response to a first input code of the plurality of input codes;

generating a plurality of raw codes by an analog to digital converter (ADC) responsive to the first calibration signal, the ADC coupled to the DAC; and storing a first output code in a storage circuit corresponding to the first input code, the first output code is obtained using the plurality of raw codes.

15. The method of claim 14, wherein the first output code is average of the plurality of raw codes.

16. The method of claim 14, wherein the plurality of input codes includes the first input code and a second input code, and a difference between the first input code and the second input code is M, where M is an integer.

17. The method of claim 16 further comprising:

storing the first output code corresponding to the first input code in a first location in a storage circuit;

storing a second output code corresponding to a second input code in a second location in the storage circuit; and incrementing the second output code by defined bits when the second output code is less than a predetermined threshold and storing the second output code in a third location in the storage circuit.

18. The method of claim 17 further comprising:

providing an input voltage to the ADC;

generating a raw code by the ADC responsive to the input voltage; and generating an output code as a final output, the output code corresponds to the raw code and stored in the storage circuit coupled to the ADC.

19. The method of claim 17 further comprising:

activating a first preamplifier, the ADC includes the first preamplifier and a second preamplifier, the first and second preamplifiers have successive threshold voltages;

processing M+L input codes through the first preamplifier, where M and L are integers;

storing M+L output codes corresponding to M+L input codes, the first preamplifier toggles at Mth input code;

inactivating the first preamplifier and activating the second preamplifier;

modifying the input code to M−L+1; and storing output codes corresponding to each input code from (M−L+1)th input code processed through the second preamplifier.

20. The method of claim 19 further comprising:

activating the first preamplifier;

storing M+T output codes corresponding to M+T input codes processed through the first preamplifier, the first preamplifier toggles at Mth input code and the raw code saturates at Tth input code;

inactivating the first preamplifier and activating the second preamplifier;

decrementing the input code from Lth input code to Dth input code, wherein the raw code saturates at Dth input code, where M, T and D are integers; and storing output codes corresponding to each input code from Dth input code.

21. The method of claim 19 further comprising:

activating a first preamplifier, the ADC includes the first preamplifier and a second preamplifier, the first and second preamplifiers have successive threshold voltages;

processing M+L input codes through the first preamplifier, where M and L are integers;

storing M+L output codes corresponding to M+L input codes, the first preamplifier toggles at Mth input code;

inactivating the first preamplifier and activating the second preamplifier;

modifying the input code to M−L+1;

storing output codes corresponding to each input code from (M−L+1)th input code processed through the second preamplifier;

estimating a discontinuity parameter from the output codes generated through the first preamplifier from Mth input code to Lth input code and the output codes generated through the second preamplifier from Lth input code to the Mth input code; and adding the discontinuity parameter to output codes generated through the second and successive preamplifiers, when the discontinuity parameter is greater than a first threshold.

22. A device comprising:

a processor;

a memory module coupled to the processor; and a circuit coupled to the processor and the memory module, the circuit comprising:

a calibration engine configured to generate a plurality of input codes;

a digital to analog converter (DAC) coupled to the calibration engine, and configured to generate a first calibration signal in response to a first input code of the plurality of input codes;

an analog to digital converter (ADC) coupled to the DAC and configured to generate a plurality of raw codes responsive to the first calibration signal; and a storage circuit coupled to the ADC and configured to store a first output code corresponding to the first input code, the first output code is obtained using the plurality of raw codes generated by the ADC.

* * * * *